US011703358B2

(12) United States Patent
Umehara et al.

(10) Patent No.: US 11,703,358 B2
(45) Date of Patent: *Jul. 18, 2023

(54) MAGNETIC SENSOR, MAGNETIC ENCODER, AND LENS POSITION DETECTION DEVICE

(71) Applicant: TDK CORPORATION, Tokyo (JP)

(72) Inventors: Tsuyoshi Umehara, Tokyo (JP); Hiraku Hirabayashi, Tokyo (JP); Yongfu Cai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/713,583

(22) Filed: Apr. 5, 2022

(65) Prior Publication Data
US 2022/0333953 A1 Oct. 20, 2022

(30) Foreign Application Priority Data

Apr. 15, 2021 (JP) ................... 2021-069290

(51) Int. Cl.
G01D 5/16 (2006.01)
G01R 33/09 (2006.01)
(Continued)

(52) U.S. Cl.
CPC ............... *G01D 5/16* (2013.01); *G01B 7/003* (2013.01); *G01R 33/096* (2013.01); *G01R 33/098* (2013.01); *G02B 7/10* (2013.01)

(58) Field of Classification Search
CPC ...... G01D 5/12–2525; G02B 7/04–105; G01R 33/06–098
See application file for complete search history.

(56) References Cited

U.S. PATENT DOCUMENTS 11,360,286 B2 * 6/2022 Cai ........................ G02B 7/04
2012/0119729 A1 * 5/2012 Komasaki ............. B82Y 25/00
324/207.21
(Continued)

FOREIGN PATENT DOCUMENTS

EP 2 267 413 A1 12/2010
JP S63-225124 A 9/1988
(Continued)

OTHER PUBLICATIONS

Translation dated Feb. 14, 2023 Office Action issued in Japanese Application No. 2021-069290.

*Primary Examiner* — Huy Q Phan
*Assistant Examiner* — David B Frederiksen
(74) *Attorney, Agent, or Firm* — Oliff PLC

(57) ABSTRACT

A magnetic sensor includes first to fourth resistors, a power supply port, a ground port, a first output port, and a second output port. The first resistor and the second resistor are located in a first region and connected in series via a first connection point connected to the first output port. The third resistor and the fourth resistor are located in a second region and connected in series via a second connection point connected to the second output port, at least a part of the second region being located at a position different from the first region in a direction parallel to an X direction. The first and second resistors are located between the third and fourth resistors in a direction parallel to a Y direction.

16 Claims, 13 Drawing Sheets

(51) Int. Cl.
*G01B 7/00* (2006.01)
*G02B 7/10* (2021.01)

(56) References Cited

U.S. PATENT DOCUMENTS

| | | | | |
|---|---|---|---|---|
| 2013/0300402 | A1* | 11/2013 | Liu | G01R 33/093 |
| | | | | 324/252 |
| 2015/0066426 | A1* | 3/2015 | Hirota | G01D 5/145 |
| | | | | 702/151 |
| 2015/0253162 | A1 | 9/2015 | Kusumi et al. | |
| 2015/0354987 | A1 | 12/2015 | Kusumi et al. | |
| 2020/0321159 | A1* | 10/2020 | Han | G01R 33/098 |
| 2020/0340833 | A1* | 10/2020 | Kulla | G01D 5/16 |
| 2021/0293911 | A1* | 9/2021 | Lassalle-Balier | G01R 33/098 |
| 2021/0318513 | A1 | 10/2021 | Cai et al. | |

FOREIGN PATENT DOCUMENTS

| | | |
|---|---|---|
| JP | 2014-126476 A | 7/2014 |
| JP | 2015-232473 A | 12/2015 |
| WO | 2009/031558 A1 | 3/2009 |

* cited by examiner

MAGNETIC SENSOR, MAGNETIC ENCODER, AND LENS POSITION DETECTION DEVICE

CROSS REFERENCE TO RELATED APPLICATIONS

This application claims the benefit of Japanese Priority Patent Application No. 2021-069290 filed on Apr. 15, 2021, the entire contents of which are incorporated herein by reference.

BACKGROUND

The present technology relates to a magnetic sensor, and a magnetic encoder and a lens position detection device using the magnetic sensor.

A magnetic encoder using a magnetic sensor is used to detect the position of a movable object whose position changes in a predetermined direction. The predetermined direction is a straight direction or a rotational direction. The magnetic encoder used to detect the position of the movable object is configured so that the position of a magnetic field generator, such as a magnetic scale, relative to the magnetic sensor changes within a predetermined range depending on the change in the position of the movable object.

As the position of the magnetic field generator relative to the magnetic sensor changes, the strength of a component of a target magnetic field, which is generated by the magnetic field generator and applied to the magnetic sensor, in one direction changes. For example, the magnetic sensor detects the strength of the component of the target magnetic field in one direction, and generates two detection signals that correspond to the strength of the component in the one direction and have respective difference phases. The magnetic encoder generates a detection value having a correspondence with the position of the magnetic field generator relative to the magnetic sensor on the basis of the two detection signals.

A magnetic sensor including a plurality of magnetoresistive elements is used as the magnetic sensor for the magnetic encoder. For example, WO 2009/031558 and EP 2267413 A1 disclose a magnetic sensor in which a plurality of giant magnetoresistive (GM R) elements are arranged as the magnetoresistive elements in a direction of relative movement between a magnet and the magnetic sensor and a direction orthogonal to the direction of relative movement.

In particular, in the magnetic sensor disclosed in EP 2267413 A1, the plurality of GMR elements constitute a phase-A bridge circuit and a phase-B bridge circuit. In the magnetic sensor, the plurality of GMR elements are arranged in the direction of relative movement at center-to-center distances of $\lambda$, $\lambda/2$, or $\lambda/4$, with the center-to-center distance (pitch) of the N and S poles of the magnet as $\lambda$. The phase-A bridge circuit and the phase-B bridge circuit produce output waveforms $\lambda/2$ different in phase.

By the way, magnetic encoders are known to cause distortion in the waveforms of the detection signals of their magnetic sensor due to harmonics. If the output waveforms of the detection signals of the magnetic sensor are distorted, the position of the magnetic field generator relative to the magnetic sensor is unable to be accurately detected. In view of this, JP 63-225124 A discloses a magnetic sensor that cancels harmonics by arranging a plurality of magnetoresistive elements at predetermined distances on the basis of the NS pitch of a signal magnetic field from a magnetic medium and the orders of the harmonics.

US 2015/0253162 A1 discloses a magnetic sensor in which a plurality of tunnel magnetoresistive (TMR) elements are arranged along the longitudinal direction of a magnetic scale at positions where odd-ordered harmonic distortion can be cancelled, on the basis of the wavelength $\lambda$ of a recording signal from the magnetic scale or a pitch P that is $\frac{1}{2}$ of $\lambda$. This magnetic sensor includes –COS detecting sections, COS detecting sections, –SIN detecting sections, and SIN detecting sections in each of which a plurality of TMR elements are compactly arranged and that are arranged in a width direction of the magnetic scale. The –COS detecting sections and the COS detecting sections are arranged in the longitudinal direction of the magnetic scale at a distance of one pitch P. The –SIN detecting sections and the SIN detecting sections are arranged in the longitudinal direction of the magnetic scale at a distance of one pitch P. The –COS detecting sections and the –SIN detecting sections are arranged in the longitudinal direction of the magnetic scale at a distance of one half of one pitch P (i.e., $\lambda/4$).

In the magnetic encoder using the magnetic sensor, the magnetic sensor is installed to face the magnetic field generator in a predetermined orientation. In reality, however, the magnetic sensor can be skewed because of the installation accuracy of the magnetic sensor. A skew of the magnetic sensor causes a problem that the detection accuracy of the position of the magnetic field generator relative to the magnetic sensor drops. In particular, the problem due to a skew of the magnetic sensor becomes pronounced if a plurality of magnetoresistive elements are arranged along the longitudinal direction of the magnetic scale, like the magnetic sensor disclosed in US 2015/0253162 A1.

SUMMARY

A magnetic sensor according to one embodiment of the technology detects a target magnetic field including a magnetic field component in a first direction parallel to an imaginary straight line. The magnetic sensor according to one embodiment of the technology includes first to fourth resistors each configured to change in resistance with strength of the magnetic field component, a power supply port to which a current of predetermined magnitude is supplied, a ground port that is grounded, a first output port, and a second output port.

The first resistor and the second resistor are located in a first region and connected in series via a first connection point connected to the first output port. The third resistor and the fourth resistor are located in a second region and connected in series via a second connection point connected to the second output port, at least a part of the second region being located at a position different from the first region in the first direction. An end of the first resistor opposite to the first connection point and an end of the third resistor opposite to the second connection point are connected to the power supply port. An end of the second resistor opposite to the first connection point and an end of the fourth resistor opposite to the second connection point are connected to the ground port.

The first and second resistors are located between the third and fourth resistors in a second direction orthogonal to the first direction.

In the magnetic sensor according to one embodiment of the technology, a center of gravity of the first resistor when viewed in a third direction orthogonal to the first and second directions and a center of gravity of the second resistor when viewed in the third direction may be located at positions symmetrical about the imaginary straight line. A center of gravity of the third resistor when viewed in the third direction and a center of gravity of the fourth resistor when viewed in the third direction may be located at positions symmetrical about the imaginary straight line.

In the magnetic sensor according to one embodiment of the technology, a center of gravity of a group including the first and third resistors when viewed in the third direction orthogonal to the first and second directions and a center of gravity of a group including the second and fourth resistors when viewed in the third direction may be located at positions symmetrical about the imaginary straight line.

In the magnetic sensor according to one embodiment of the technology the first to fourth resistors may each include a plurality of magnetoresistive elements. The plurality of magnetoresistive elements each include a magnetization pinned layer having a magnetization whose direction is fixed, a free layer having a magnetization whose direction is variable depending on the direction and the strength of the magnetic field component, and a gap layer located between the magnetization pinned layer and the free layer.

If each of the first to fourth resistors includes a plurality of magnetoresistive elements, the direction of the magnetization of the magnetization pinned layer in each of the plurality of magnetoresistive elements included in the first and third resistors may be a first magnetization direction. The direction of the magnetization of the magnetization pinned layer in each of the plurality of magnetoresistive elements included in the second and fourth resistors may be a second magnetization direction opposite to the first magnetization direction.

If each of the first to fourth resistors includes a plurality of magnetoresistive elements, the plurality of magnetoresistive elements of the first resistor and the plurality of magnetoresistive elements of the second resistor may be located at positions symmetrical about the imaginary straight line. The plurality of magnetoresistive elements of the third resistor and the plurality of magnetoresistive elements of the fourth resistor may be located at positions symmetrical about the imaginary straight line.

If each of the first to fourth resistors includes a plurality of magnetoresistive elements, each of the plurality of magnetoresistive elements may further include a bias magnetic field generator that generates a bias magnetic field in a direction intersecting the first direction, the bias magnetic field being applied to the free layer. Alternatively, the free layer may have magnetic shape anisotropy with a direction of an easy axis of magnetization intersecting the first direction.

If each of the first to fourth resistors includes a plurality of magnetoresistive elements, the gap layer may be a tunnel barrier layer.

A magnetic encoder according to one embodiment of the technology includes the magnetic sensor according to one embodiment of the technology, and a magnetic field generator that generates the target magnetic field. The magnetic sensor and the magnetic field generator are configured so that the strength of the magnetic field component changes with a change in a position of the magnetic field generator relative to the magnetic sensor.

The magnetic encoder according to one embodiment of the technology may further include a detection value generation circuit. In such a case, the magnetic sensor may generate a first detection signal having a correspondence with a potential at the first output port, and generate a second detection signal having a correspondence with a potential at the second output port. The detection value generation circuit may generate a detection value having a correspondence with the position of the magnetic field generator relative to the magnetic sensor on the basis of the first and second detection signals.

In the magnetic encoder according to one embodiment of the technology, the magnetic field generator may be a magnetic scale including a plurality of pairs of N and S poles alternately arranged in a predetermined direction. In such a case, the first and second detection signals may each contain an ideal component varying periodically to trace an ideal sinusoidal curve, and an error component corresponding to a harmonic of the ideal component. The first to fourth resistors may be configured so that the ideal component of the first detection signal and the ideal component of the second detection signal have respective different phases and the error components are reduced.

A lens position detection device according to one embodiment of the technology is intended to detect a position of a lens whose position is variable. The lens position detection device according to one embodiment of the technology includes the magnetic sensor according to one embodiment of the technology, and a magnetic field generator that generates the target magnetic field. The lens is configured to be movable in the first direction. The magnetic sensor and the magnetic field generator are configured so that the strength of the magnetic field component changes with a change in the position of the lens.

The lens position detection device according to one embodiment of the technology may further include a detection value generation circuit. In such a case, the magnetic sensor may generate a first detection signal having a correspondence with a potential at the first output port, and generate a second detection signal having a correspondence with a potential at the second output port. The detection value generation circuit may generate a detection value having a correspondence with the position of the lens on the basis of the first and second detection signals.

In the lens position detection device according to one embodiment of the technology, the magnetic field generator may be a magnetic scale including a plurality of pairs of N and S poles alternately arranged in a predetermined direction. In such a case, the first and second detection signals may each contain an ideal component varying periodically to trace an ideal sinusoidal curve, and an error component corresponding to a harmonic of the ideal component. The first to fourth resistors may be configured so that the ideal component of the first detection signal and the ideal component of the second detection signal have respective different phases and the error components are reduced.

A manufacturing method for the magnetic sensor according to one embodiment of the technology is a method of manufacturing the magnetic sensor according to the one embodiment of the technology. In the magnetic sensor manufactured by the manufacturing method for the magnetic sensor according to the one embodiment of the technology, the first to fourth resistors each include a plurality of magnetoresistive elements. The plurality of magnetoresistive elements each include a magnetization pinned layer having a magnetization whose direction is fixed, a free layer having a magnetization whose direction is variable depending on the direction and the strength of the magnetic field component, and a gap layer located between the magnetization pinned layer and the free layer.

The manufacturing method for the magnetic sensor according to the one embodiment of the technology includes a step of forming the plurality of magnetoresistive elements. The step of forming the plurality of magnetoresistive elements includes a step of forming a plurality of initial magnetoresistive elements each including an initial magnetization pinned layer to later become the magnetization pinned layer, the free layer, and the gap layer, and a step of fixing a magnetization direction of the initial magnetization pinned layer using laser light and an external magnetic field.

In the magnetic sensor, the magnetic encoder, and the lens position detection device according to the one embodiment of the technology, the first and second resistors are located between the third and fourth resistors in the second direction. According to one embodiment of the technology, the occurrence of the problem due to a skew of the magnetic sensor can thus be suppressed.

Other and further objects, features and advantages of the technology will appear more fully from the following description.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the technology.

DETAILED DESCRIPTION

Figure 1:
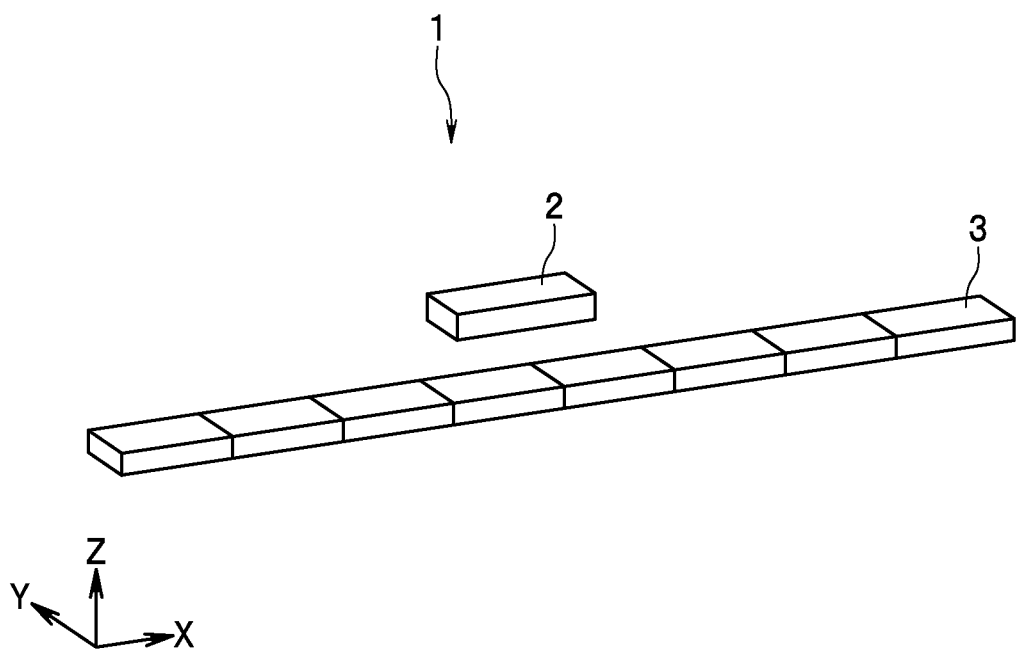
FIG. 1 is a perspective view showing a magnetic encoder according to a first example embodiment of the technology.

An object of the technology is to provide a magnetic sensor that can suppress the occurrence of the problem due to a skew of the magnetic sensor, and a magnetic encoder and a lens position detection device using the magnetic sensor.

In the following, some example embodiments and modification examples of the technology are described in detail with reference to the accompanying drawings. Note that the following description is directed to illustrative examples of the disclosure and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

First Example Embodiment

Figure 2:
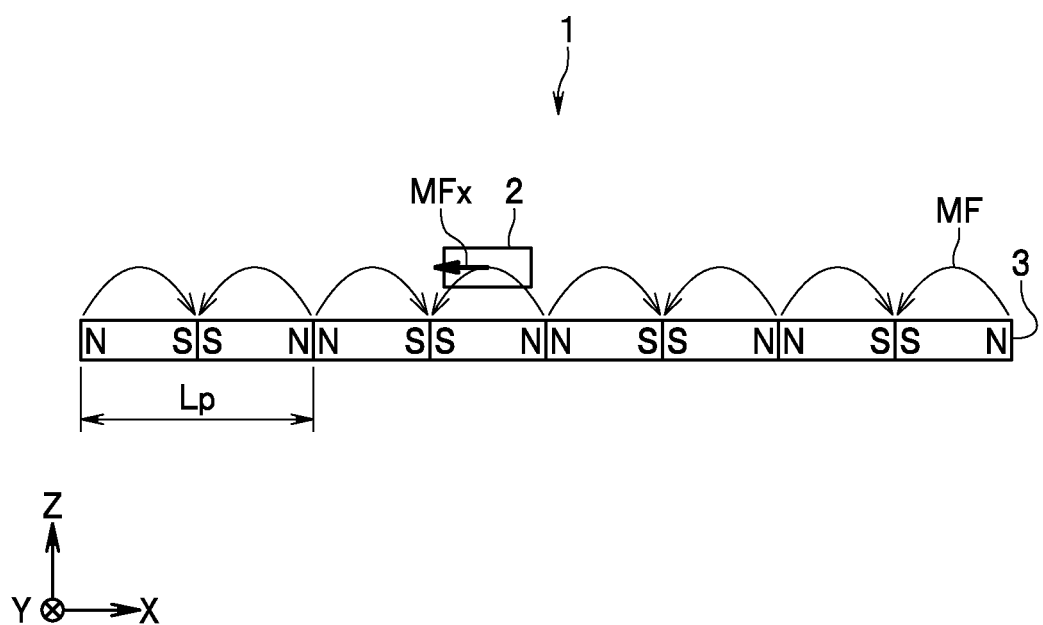
FIG. 2 is a front view showing the magnetic encoder according to the first example embodiment of the technology.

Example embodiments of the technology will now be described in detail with reference to the drawings. A schematic configuration of a magnetic encoder according to a first example embodiment of the technology will initially be described with reference to FIGS. 1 and 2. FIG. 1 is a perspective view showing a magnetic encoder 1. FIG. 2 is a front view showing the magnetic encoder 1. The magnetic encoder 1 according to the present example embodiment includes a magnetic sensor 2 according to the present example embodiment and a magnetic field generator 3.

The magnetic field generator 3 generates a target magnetic field MF that is a magnetic field for the magnetic sensor 2 to detect (magnetic field to be detected). The target magnetic field MF includes a magnetic field component in a direction parallel to an imaginary straight line. The magnetic sensor 2 and the magnetic field generator 3 are configured so that the strength of the magnetic field component changes with a change in the position of the magnetic field generator 3 relative to the magnetic sensor 2. The magnetic sensor 2 detects the target magnetic field MF including the magnetic field component, and generates at least one detection signal corresponding to the strength of the magnetic field component.

The magnetic field generator 3 may be a magnetic scale including a plurality of pairs of N and S poles alternately arranged in a predetermined direction. The magnetic scale may be a magnetic medium, such as a magnetic tape, that is alternately magnetized to a plurality of pairs of N and S poles. The magnetic scale may be a plurality of magnets arranged along the foregoing predetermined direction. The magnetic sensor 2 or the magnetic field generator 3 is movable within a predetermined range along the predetermined direction. As the magnetic sensor 2 or the magnetic field generator 3 moves, the position of the magnetic field generator 3 relative to the magnetic sensor 2 changes. The predetermined direction may be a linear direction or a rotational direction.

In the present example embodiment, the magnetic field generator 3 is a linear scale magnetized to a plurality of pairs of N and S poles in a linear direction. The magnetic sensor 2 or the magnetic field generator 3 is movable along the longitudinal direction of the magnetic field generator 3. As shown in FIG. 2, the distance between two N poles adjoining in the longitudinal direction of the magnetic field generator 3 (the same as the distance between two S poles adjoining in the longitudinal direction of the magnetic field generator 3) will be referred to as one pitch. The size of one pitch will be denoted by the symbol Lp.

Now, we define X, Y, and Z directions as shown in FIGS. 1 and 2. In the present example embodiment, a direction parallel to the longitudinal direction of the magnetic field generator 3 will be referred to as an X direction. Two mutually orthogonal directions perpendicular to the X direction are referred to as the Y and Z directions. In FIG. 2, the Y direction is shown as a direction from the near side to the far side of FIG. 2. The opposite directions to the X, Y, and Z directions will be referred to as −X, −Y, and −Z directions, respectively.

The magnetic sensor 2 is located away from the magnetic field generator 3 in the Z direction. The magnetic sensor 2 is configured to be able to detect the strength of a magnetic field component MFx of the target magnetic field MF at a predetermined position in a direction parallel to the X direction. For example, the strength of the magnetic field component MFx is expressed in positive values if the direction of the magnetic field component MFx is the X direction, and in negative values if the direction of the magnetic field component MFx is the −X direction. The strength of the magnetic field component MFx changes periodically as the magnetic sensor 2 or the magnetic field generator 3 moves along the direction parallel to the X direction. The direction parallel to the X direction corresponds to a first direction according to the technology.

Figures 3, 4:
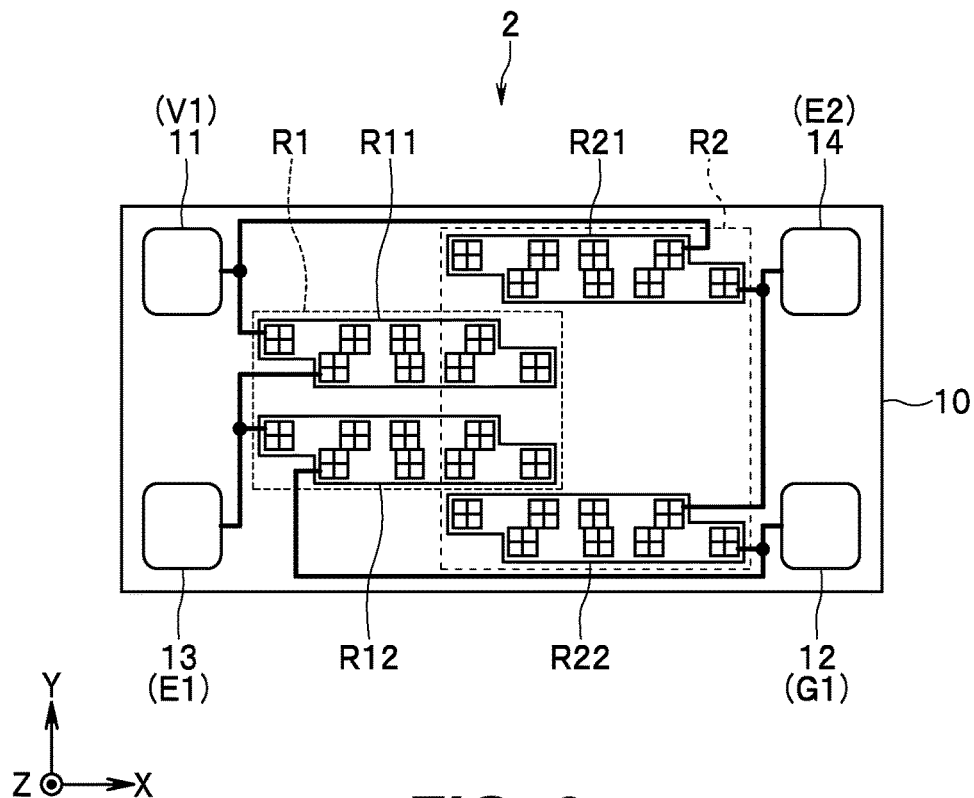
FIG. 3 is a plan view showing a magnetic sensor according to the first example embodiment of the technology.
FIG. 4 is a circuit diagram showing the configuration of the magnetic sensor according to the first example embodiment of the technology.

Next, the magnetic sensor 2 will be described in detail with reference to FIGS. 3 and 4. FIG. 3 is a plan view showing the magnetic sensor 2. FIG. 4 is a circuit diagram showing the configuration of the magnetic sensor 2. As shown in FIG. 4, the magnetic encoder 1 further includes a detection value generation circuit 4. The detection value generation circuit 4 generates a detection value Vs having a correspondence with the position of the magnetic field generator 3 relative to the magnetic sensor 2 on the basis of the at least one detection signal corresponding to the strength of the magnetic field component MFx, generated by the magnetic sensor 2. The detection value generation circuit 4 can be implemented by an application specific integrated circuit (ASIC) or a microcomputer, for example.

The magnetic sensor 2 includes a first resistor R11, a second resistor R12, a third resistor R21, and a fourth resistor R22 each configured to change in resistance with the strength of the magnetic field component MFx. The first to fourth resistors R11, R12, R21, and R22 each include a plurality of magnetoresistive elements (hereinafter referred to as MR elements) 50.

The magnetic sensor 2 further includes a power supply port V1, a ground port G1, a first output port E1, and a second output port E2. The ground port G1 is connected to the ground. The first and second output ports E1 and E2 are connected to the detection value generation circuit 4. The magnetic sensor 2 may be driven by a constant voltage or driven by a constant current. In the case where the magnetic sensor 2 is driven by a constant voltage, a voltage of predetermined magnitude is applied to the power supply port V1. In the case where the magnetic sensor 2 is driven by a constant current, a current of predetermined magnitude is supplied to the power supply port V1.

The magnetic sensor 2 generates a signal having a correspondence with the potential at the first output port E1 as a first detection signal S1, and generates a signal having a correspondence with the potential at the second output port E2 as a second detection signal S2. The detection value generation circuit 4 generates the detection value Vs on the basis of the first and second detection signals S1 and S2. At least either the magnetic sensor 2 or the detection value generation circuit 4 may be configured to be able to correct the amplitude, phase, and offset of each of the first and second detection signals S1 and S2.

As shown in FIG. 4, the first resistor R11 and the second resistor R12 are connected in series via a first connection point P1 connected to the first output port E1. The third resistor R21 and the fourth resistor R22 are connected in series via a second connection point P2 connected to the second output port E2.

In circuit configuration, the first resistor R11 is located between the power supply port V1 and the first connection point P1. An end of the first resistor R11 opposite to the first connection point P1 is connected to the power supply port V1. The phrase "in circuit configuration" is herein used to describe layout in a circuit diagram, not in a physical configuration. The foregoing end of the first resistor R11 is an end in the circuit diagram.

In circuit configuration, the second resistor R12 is located between the ground port G1 and the first connection point P1. An end (end in the circuit diagram) of the second resistor R12 opposite to the first connection point P1 is connected to the ground port G1.

In circuit configuration, the third resistor R21 is located between the power supply port V1 and the second connection point P2. An end (end in the circuit diagram) of the third resistor R21 opposite to the second connection point P2 is connected to the power supply port V1.

In circuit configuration, the fourth resistor R22 is located between the ground port G1 and the second connection point P2. An end (end in the circuit diagram) of the fourth resistor R22 opposite to the second connection point P2 is connected to the ground port G1.

As shown in FIG. 3, the magnetic sensor 2 further includes a substrate 10, and a power supply terminal 11, a ground terminal 12, a first output terminal 13, and a second output terminal 14 that are located on the substrate 10. The power supply terminal 11 constitutes the power supply port V1. The ground terminal 12 constitutes the ground port G1. The first and second output terminals 13 and 14 constitute the first and second output ports E1 and E2, respectively.

As shown in FIG. 3, the first and second resistors R11 and R12 are located in a first region R1 on the substrate 10. The third and fourth resistors R21 and R22 are located in a second region R2 on the substrate 10. At least a part of the second region R2 is located at a position different from the first region R1 in the direction parallel to the X direction. In the example shown in FIG. 3, the second region R2 overlaps the first region R1.

The second region R2 may be located anterior to the first region R1 in the X direction, or anterior to the first region R1 in the −X direction. FIG. 3 shows an example where a part of the second region R2 is located anterior to a part of the first region R1 in the X direction. The first and second regions R1 and R2 may be located at the same position or at different positions in the Z direction.

As shown in FIG. 3, the first and second resistors R11 and R12 are located between the third and fourth resistors R21 and R22 in a direction parallel to the Y direction. The direction parallel to the Y direction corresponds to a second direction according to the technology.

Next, a configuration of the first to fourth resistors R11, R12, R21, and R22 will be described. Each of the first and second detection signals S1 and S2 contains an ideal component which varies periodically with a predetermined signal period in such a manner as to trace an ideal sinusoidal curve (including sine and cosine waveforms). In the present example embodiment, the first to fourth resistors R11, R12, R21, and R22 are configured so that the ideal component of the first detection signal S1 and the ideal component of the second detection signal S2 have respective different phases. The size Lp of one pitch shown in FIG. 2 corresponds to one period of the ideal components, i.e., an electrical angle of 360°.

Each of the first and second detection signals S1 and S2 contains error components corresponding to harmonics of the ideal component aside from the ideal component. In the present example embodiment, the first to fourth resistors R11, R12, R21, and R22 are configured to reduce the error components.

The configuration of the first to fourth resistors R11, R12, R21, and R22 will be described in detail below. Initially, the configuration of the MR elements 50 will be described. In the present example embodiment, the MR elements 50 are each a spin-valve MR element. The spin-valve MR element includes a magnetization pinned layer having a magnetization whose direction is fixed, a free layer having a magnetization whose direction is variable depending on the magnetic field component MFx, and a gap layer located between the magnetization pinned layer and the free layer. The spin-valve MR element may be a tunneling magnetoresistive (TMR) element or a giant magnetoresistive (GMR) element. In particular, in the present example embodiment, the MR element 50 is desirably a TMR element to reduce the dimensions of the magnetic sensor 2. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°.

In FIG. 4, the arrows shown inside the first to fourth resistors R11, R12, R21, and R22 indicate the magnetization directions of the magnetization pinned layers in the respective plurality of MR elements 50 included in the resistors. The magnetization directions of the magnetization pinned layers in the respective plurality of MR elements 50 included in the first and third resistors R11 and R21 are a first magnetization direction. The magnetization directions of the magnetization pinned layers in the respective plurality of MR elements 50 included in the second and fourth resistors R12 and R22 are a second magnetization direction opposite to the first magnetization direction.

In particular, in the present example embodiment, the first magnetization direction is the −X direction, and the second magnetization direction is the X direction. In such a case, the magnetization directions of the free layers in the respective plurality of MR elements 50 change within the XY plane with the strength of the magnetic field component MFx. Consequently, the potential at each of the first and second output ports E1 and E2 changes with the strength of the magnetic field component MFx.

Next, the layout of the first to fourth resistors R11, R12, R21, and R22 will be described. In the following description, the layout of the first to fourth resistors R11, R12, R21, and R22 will be described with reference to the centers of gravity of the resistors when viewed in the Z direction. The Z direction corresponds to a third direction according to the technology.

Figure 5:
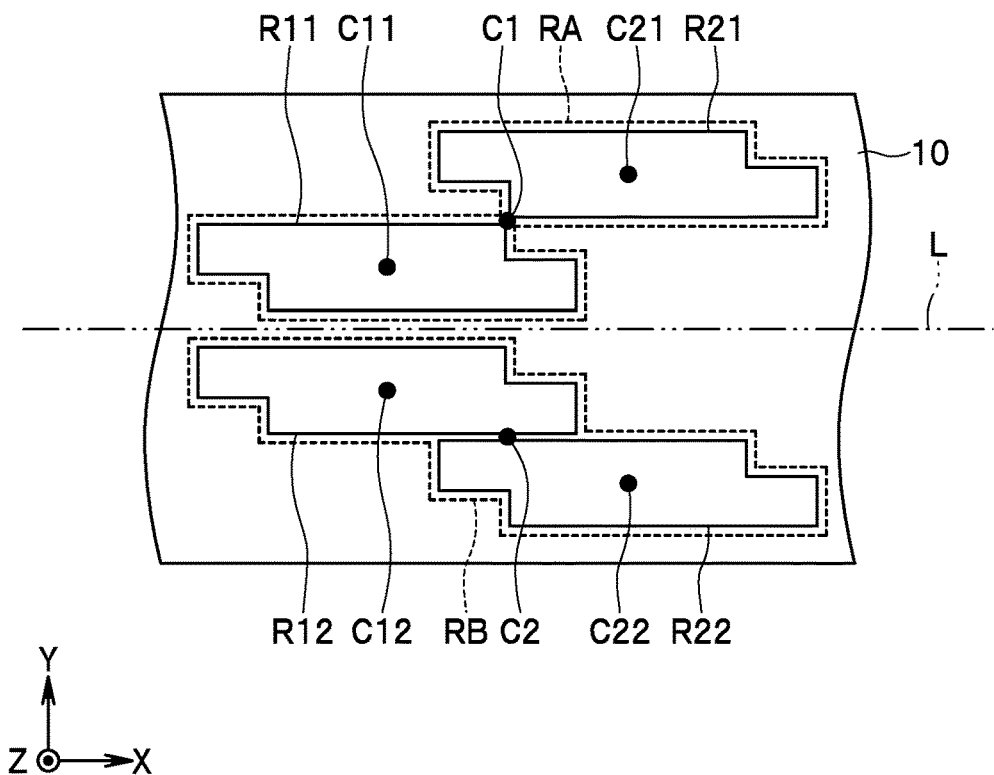
FIG. 5 is an explanatory diagram for describing the layout of first to fourth resistors of the first example embodiment of the technology.

FIG. 5 is an explanatory diagram for describing the layout of the first to fourth resistors R11, R12, R21, and R22. The second resistor R12 is located at the same position as the first resistor R11 is in the X direction. The second resistor R12 is also located in front of the first resistor R11 in the −Y direction.

The third resistor R21 is located at a position Lp/4 away from the first resistor R11 in the X direction. The third resistor R21 is also located anterior to the first resistor R11 in the Y direction.

The fourth resistor R22 is located at a position Lp/4 away from the second resistor R12 in the X direction. The fourth resistor R22 is located at the same position as the third resistor R21 is in the X direction. The fourth resistor R22 is also located anterior to the second resistor R12 in the −Y direction.

In FIG. 5, the symbol L denotes an imaginary straight line parallel to the X direction. The imaginary straight line L corresponds to an imaginary straight line according to the technology. In particular, in the present example embodiment, the center of gravity C11 of the first resistor R11 when viewed in the Z direction and the center of gravity C12 of the second resistor R12 when viewed in the Z direction are located at positions symmetrical about the imaginary straight line L. The center of gravity C21 of the third resistor R21 when viewed in the Z direction and the center of gravity C22 of the fourth resistor R22 when viewed in the Z direction are located at positions symmetrical about the imaginary straight line L.

In FIG. 5, a broken-lined region denoted by the symbol RA represents a group including the first and third resistors R11 and R21. A broken-lined region denoted by the symbol RB represents a group including the second and fourth resistors R12 and R22. The center of gravity C1 of the group RA when viewed in the Z direction and the center of gravity C2 of the group RB when viewed in the Z direction are located at positions symmetrical about the imaginary straight line L.

Next, the layout of the plurality of MR elements 50 in each of the first to fourth resistors R11, R12, R21, and R22 will be described. As employed herein, a set of one or more MR elements 50 will be referred to as an element group. The first to fourth resistors R11, R12, R21, and R22 each include a plurality of element groups. To reduce the error components, the plurality of element groups are located at predetermined distances from each other on the basis of the size Lp of one pitch. In the following description, the layout of the plurality of element groups will be described with reference to predetermined positions of the element groups. An example of the predetermined position of an element group is the center of gravity of the element group when viewed in the Z direction.

Figure 6:
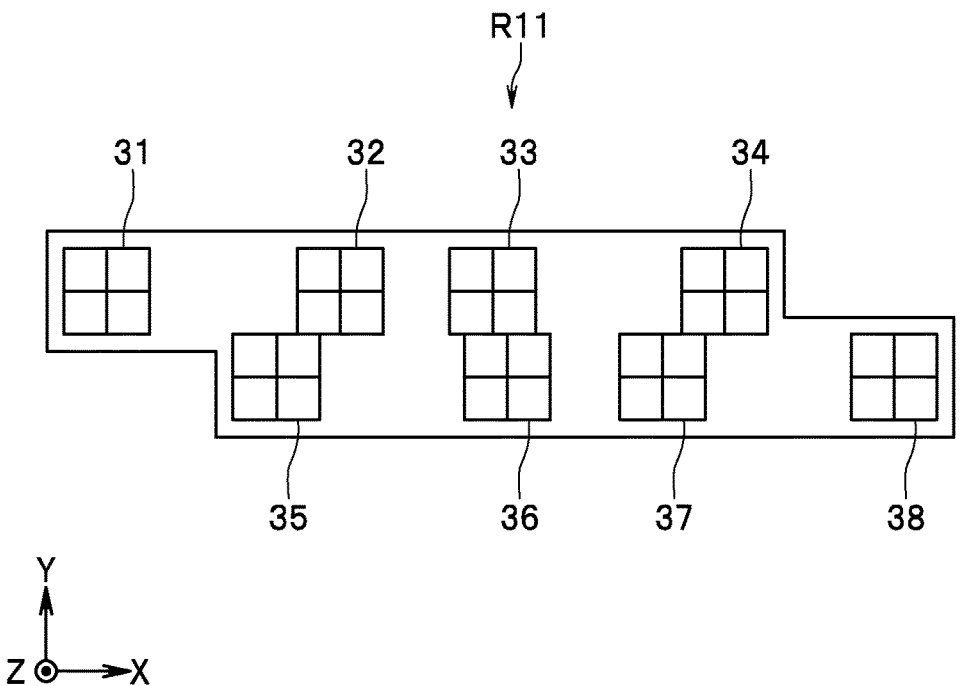
FIG. 6 is a plan view showing a first resistor of the first example embodiment of the technology.

FIG. 6 is a plan view showing the first resistor R11. As shown in FIG. 6, the first resistor R11 includes eight element groups 31, 32, 33, 34, 35, 36, 37, and 38. Each of the element groups 31 to 38 is divided into four sections. Each section includes one or more MR elements 50. In other words, each element group includes four or more MR elements 50. The plurality of MR elements 50 may be connected in series within each element group. In such a case, the plurality of element groups may be connected in series. Alternatively, the plurality of MR elements 50 may be connected in series regardless of the element groups.

In FIG. 6, the element groups 31 to 38 are located to reduce an error component corresponding to the third harmonic (third-order harmonic) of the ideal component, an error component corresponding to the fifth harmonic (fifth-order harmonic) of the ideal component, and an error component corresponding to the seventh harmonic (seventh-order harmonic) of the ideal component. As shown in FIG. 6, the element groups 31 to 34 are arranged along the X direction. The element group 32 is located at a position Lp/10 away from the element group 31 in the X direction. The element group 33 is located at a position Lp/6 away from the element group 31 in the X direction. The element group 34 is located at a position Lp/10+Lp/6 away from the element group 31 in the X direction (at a position Lp/6 away from the element group 32 in the X direction).

As shown in FIG. 6, the element groups 35 to 38 are arranged along the X direction, anterior to the element groups 31 to 34 in the −Y direction. The element group 35 is located at a position Lp/14 away from the element group 31 in the X direction. The element group 36 is located at a position Lp/14+Lp/10 away from the element group 31 in the X direction (at a position Lp/14 away from the element group 32 in the X direction). The element group 37 is located at a position Lp/14+Lp/6 away from the element group 31 in the X direction (at a position Lp/14 away from the element group 33 in the X direction). The element group 38 is located at a position Lp/14+Lp/10+Lp/6 away from the element group 31 in the X direction (at a position Lp/14 away from the element group 34 in the X direction).

The layout of a plurality of element groups for reducing a plurality of error components is not limited to the example shown in FIG. 6. Suppose now that n and m are integers that are greater than or equal to 1 and different from each other. For example, to reduce an error component corresponding to a (2n+1)th-order harmonic, a first element group is located at a position Lp/(4n+2) away from a second element group in the X direction. To further reduce an error component corresponding to a (2m+1)th-order harmonic, a third element group is located at a position Lp/(4m+2) away from the first element group in the X direction, and a fourth element group is located at a position Lp/(4m+2) away from the second element group in the X direction. In such a manner, to reduce error components corresponding to a plurality of harmonics, each of a plurality of element groups for reducing an error component corresponding to one harmonic is located at a position a predetermined distance based on the size Lp of one pitch away from a corresponding one of a plurality of element groups for reducing an error component corresponding to another harmonic in the X direction.

In the present example embodiment, the configuration and layout of the plurality of element groups in each of the second to fourth resistors R12, R21, and R22 are the same as those of the plurality of element groups in the first resistor R11. More specifically, the second to fourth resistors R12, R21, and R22 each include eight element groups 31 to 38 having the configuration and positional relationship shown in FIG. 6. The element group 31 of the second resistor R12 is located at the same position as the element group 31 of the first resistor R11 is in the X direction. The element group 31 of the third resistor R21 is located at a position Lp/4 away from the element group 31 of the first resistor R11 in the X direction. The element group 31 of the fourth resistor R22 is located at a position Lp/4 away from the element group 31 of the second resistor R12 in the X direction.

The configuration of the first to fourth resistors R11, R12, R21, and R22 described above makes a phase difference of the ideal component of the second detection signal S2 from the ideal component of the first detection signal S1 an odd number of times ¼ of a predetermined signal period (the signal period of the ideal component), and reduces the error components of the respective first and second detection signals S1 and S2.

In the light of the production accuracy of the MR elements 50 and other factors, the magnetization directions of the magnetization pinned layers, the positions of the first to fourth resistors R11, R12, R21, and R22, and the element groups 31 to 38 may be slightly different from the above-described directions and positions.

Figure 7:
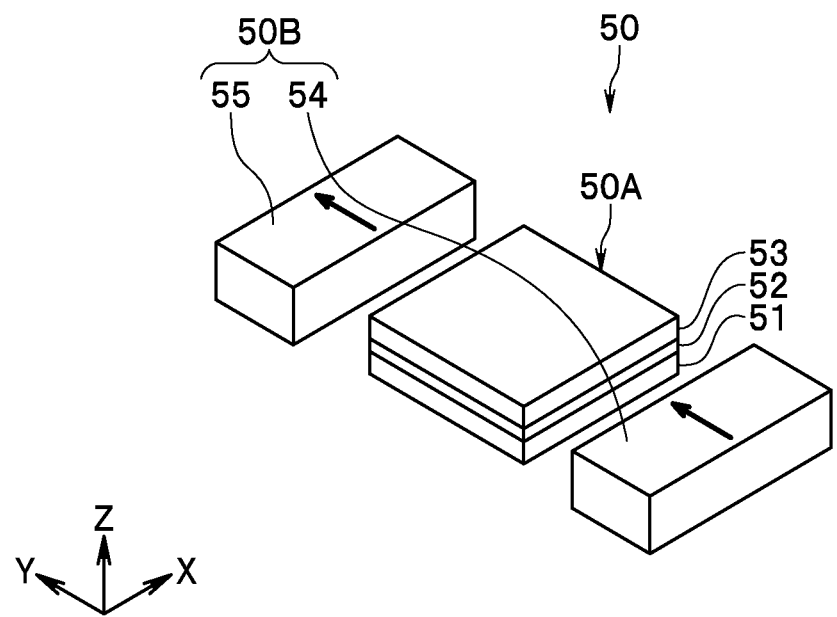
FIG. 7 is a perspective view showing a first example of a magnetoresistive element of the first example embodiment of the technology.

Next, first and second examples of an MR element 50 will be described with reference to FIGS. 7 and 8. FIG. 7 is a perspective view showing the first example of the MR element 50. In the first example, the MR element 50 includes a layered film 50A including a magnetization pinned layer 51, a gap layer 52, and a free layer 53 stacked in this order in the Z direction. The layered film 50A has a square or almost square planar shape when viewed in the Z direction.

The bottom surface of the layered film 50A of the MR element 50 is electrically connected to the bottom surface of the layered film 50A of another MR element 50 by a not-shown lower electrode. The top surface of the layered film 50A of the MR element 50 is electrically connected to the top surface of the layered film 50A of yet another MR element 50 by a not-shown upper electrode. In such a manner, the plurality of MR elements 50 are connected in series. It should be appreciated that the layers 51 to 53 of each layered film 50A may be stacked in the reverse order to that shown in FIG. 7.

The MR element 50 further includes a bias magnetic field generator 50B that generates a bias magnetic field to be applied to the free layer 53. The direction of the bias magnetic field intersects the direction parallel to the X direction. In the first example embodiment, the bias magnetic field generator 50B includes two magnets 54 and 55. The magnet 54 is located in front of the layered film 50A in the −Y direction. The magnet 55 is located in front of the layered film 50A in the Y direction. In particular, in the first example, the layered film 50A and the magnets 54 and 55 are located at positions to intersect an imaginary plane parallel to the XY plane. In FIG. 7, the arrows in the magnets 54 and 55 indicate the magnetization directions of the magnets 54 and 55. In the first example, the direction of the bias magnetic field is the Y direction.

Figure 8:
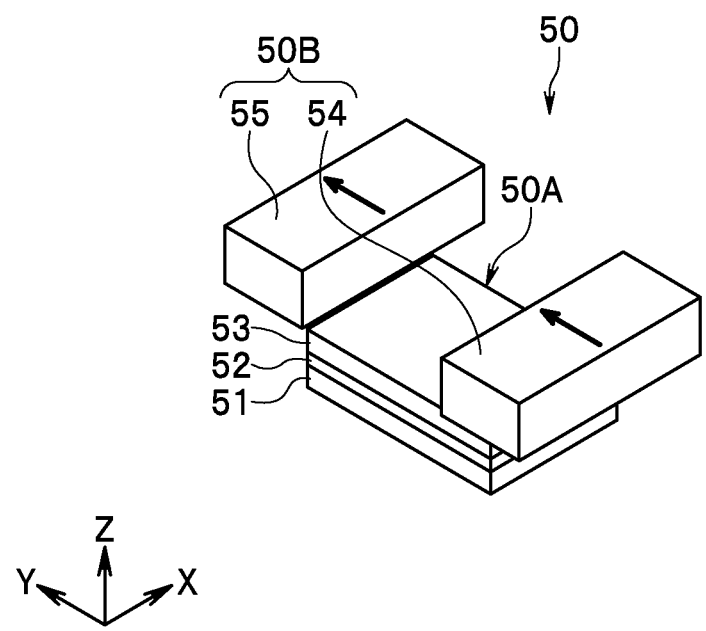
FIG. 8 is a perspective view showing a second example of the magnetoresistive element of the first example embodiment of the technology.

FIG. 8 is a perspective view showing the second example of the MR element 50. The second example of the MR element 50 has the same configuration as that of the first example of the MR element 50 except the planar shape of the layered film 50A and the positions of the magnets 54 and 55. In the second example, the magnets 54 and 55 are located at positions different from that of the layered film 50A in the Z direction. In particular, in the example shown in FIG. 8, the magnets 54 and 55 are located anterior to the layered film 50A in the Z direction. When viewed in the Z direction, the layered film 50A has a rectangular planar shape long in the Y direction. When viewed in the Z direction, the magnets 54 and 55 are located to overlap the layered film 50A.

The direction of the bias magnetic field and the layout of the magnets 54 and 55 are not limited to the examples shown in FIGS. 7 and 8. For example, the direction of the bias magnetic field may be a direction oblique to the Y direction. The magnets 54 and 55 may be located at respective different positions in the direction parallel to the X direction. Other examples of the MR element 50 will be described below as modification examples.

Next, a method for generating the detection value Vs of the present example embodiment will be described. For example, the detection value generation circuit 4 generates the detection value Vs in the following manner. The detection value generation circuit 4 determines an initial detection value in the range of 0° or more and less than 360° by calculating the arctangent of the ratio of the second detection signal S2 to the first detection signal S1, i.e., a tan(S2/S1). The initial detection value may be the value of the arctangent itself. The initial detection value may be a value obtained by adding a predetermined angle to the value of the arctangent.

If the foregoing value of the arctangent is 0°, the position of an S pole of the magnetic field generator 3 and the position of the element group 31 in each of the first and second resistors R11 and R12 coincide in the X direction. If the foregoing value of the arctangent is 180°, the position of an N pole of the magnetic field generator 3 and the position of the element group 31 in each of the first and second resistors R11 and R12 coincide in the X direction. The initial detection value thus has a correspondence with the position of the magnetic field generator 3 relative to the magnetic sensor 2 (hereinafter, also referred to as relative position) within one pitch.

The detection value generation circuit 4 also counts the number of rotations of the electrical angle from a reference position, with one period of the initial detection value as an electrical angle of 360°. One rotation of the electrical angle corresponds to the amount of movement of the relative position as much as one pitch. The detection value generation circuit 4 generates the detection value Vs having a correspondence with the relative position on the basis of the initial detection value and the number of rotations of the electrical angle.

Next, the operation and effects of the magnetic encoder 1 and the magnetic sensor 2 according to the present example embodiment will be described. In the present example embodiment, the first and second resistors R11 and R12 are located between the third and fourth resistors R21 and R22 in the direction parallel to the Y direction. This enables the present example embodiment to suppress the occurrence of the problem that the detection accuracy of the position of the magnetic field generator 3 relative to the magnetic sensor 2 drops due to a skew of the magnetic sensor 2. Such an effect will now be described with reference to a simulation result.

Figure 9:
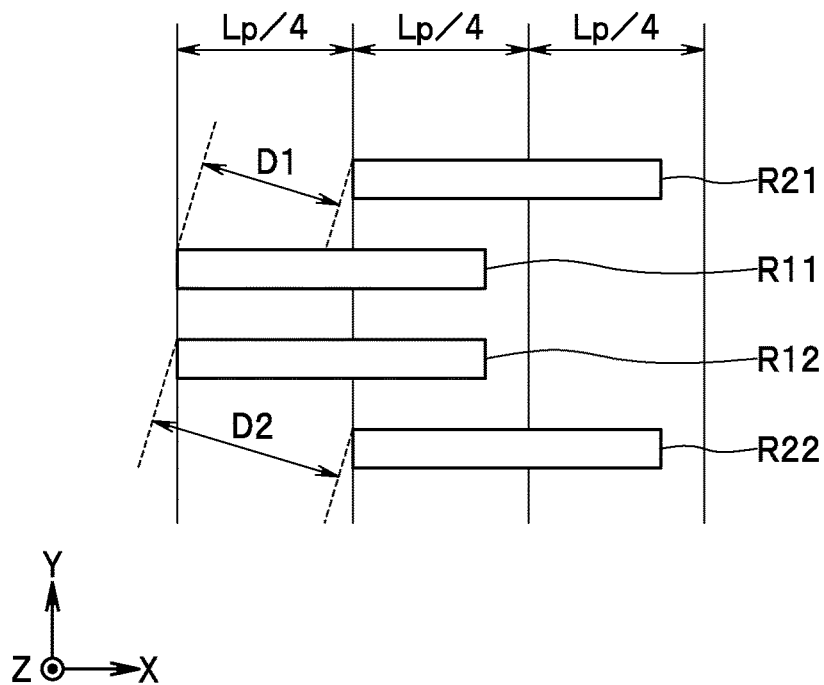
FIG. 9 is an explanatory diagram schematically showing the layout of the first to fourth resistors in a model of a first practical example.

A model of a first practical example and models of first and second comparative examples used in the simulation will initially be described. The model of the first practical example is a model for the magnetic encoder 1 according to the present example embodiment. FIG. 9 schematically shows the layout of the first to fourth resistors R11, R12, R21, and R22 in the model of the first practical example. The layout of the first to fourth resistors R11, R12, R21, and R22 in the model of the first practical example is the same as described with reference to FIGS. 5 and 6.

The models of the first and second comparative examples have basically the same configuration as that of the model of the first practical example. However, the first and second comparative examples are different from the first practical example in the layout of the first to fourth resistors R11, R12, R21, and R22 in the direction parallel to the Y direction.

Figure 10:
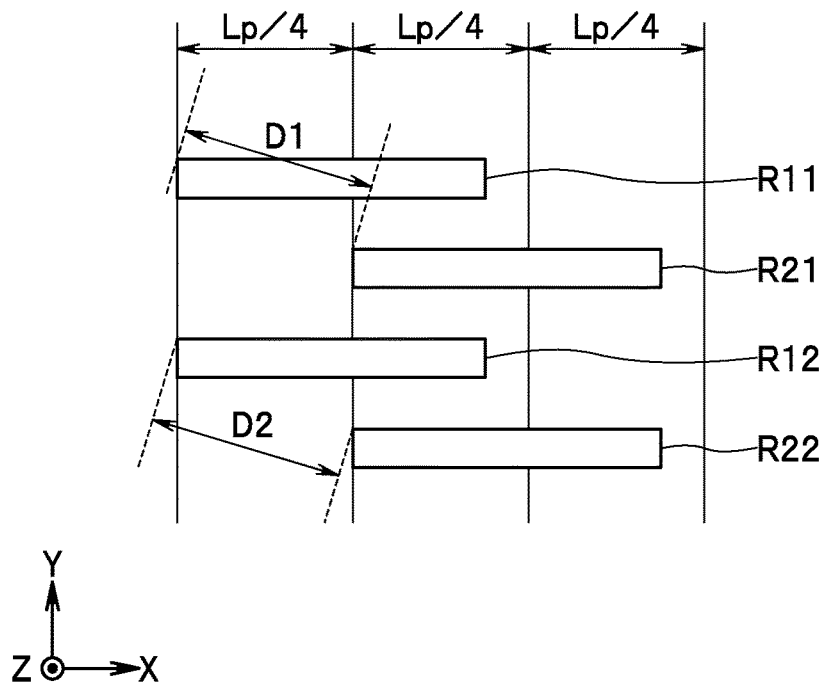
FIG. 10 is an explanatory diagram schematically showing the layout of the first to fourth resistors in a model of a first comparative example.

FIG. 10 schematically shows the layout of the first to fourth resistors R11, R12, R21, and R22 in the model of the first comparative example. In the first comparative example, the third resistor R21 is located anterior to the first resistor R11 in the −Y direction. The second resistor R12 is located anterior to the third resistor R21 in the −Y direction. The fourth resistor R22 is located anterior to the second resistor R12 in the −Y direction.

Figure 11:
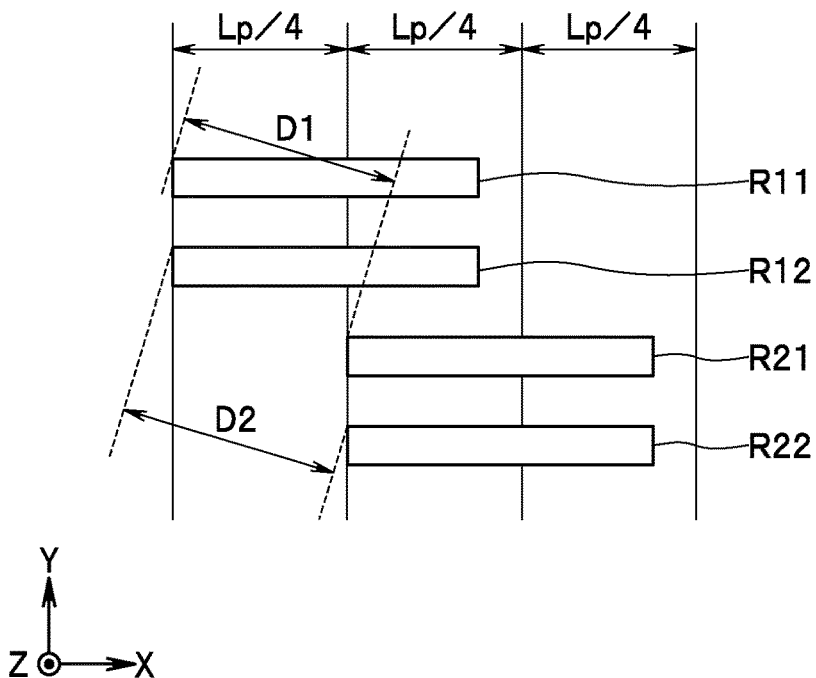
FIG. 11 is an explanatory diagram schematically showing the layout of the first to fourth resistors in a model of a second comparative example.

FIG. 11 schematically shows the layout of the first to fourth resistors R11, R12, R21, and R22 in the model of the second comparative example. In the second comparative example, the second resistor R12 is located in front of the first resistor R11 in the −Y direction. The third resistor R21 is located anterior to the second resistor R12 in the −Y direction. The fourth resistor R22 is located in front of the third resistor R21 in the −Y direction.

As shown in FIGS. 10 and 11, neither of the first and second comparative examples satisfies the requirement that the first and second resistors R11 and R12 be located between the third and fourth resistors R21 and R22 in the direction parallel to the Y direction.

In the simulation, the magnetic sensor 2 of each model was rotated to skew by a given angle about a rotation axis parallel to the Z direction. In such a state, the position (relative position) of the magnetic field generator 3 relative to the magnetic sensor 2 of each model was changed, and the resulting error was determined. In the simulation, the rotation angle of the magnetic sensor 2 when the longitudinal direction of each of the first to fourth resistors R11, R12, R21, and R22 coincided with the direction parallel to the X direction was assumed as 0°.

In the simulation, the error was determined in the following manner. Initially, the relative position was changed and the value of the arctangent of the ratio of the second detection signal S2 to the first detection signal S1, i.e., a tan(S2/S1) was determined in the range of 0° or more and less than 360°. The value of a tan(S2/S1) was determined in association with the relative position expressed by an electrical angle in the range of 0° or more and less than 360°. A difference between the value of a tan (S2/S1) and the relative position (electrical angle) associated with the value was then determined as an error.

Figure 12:
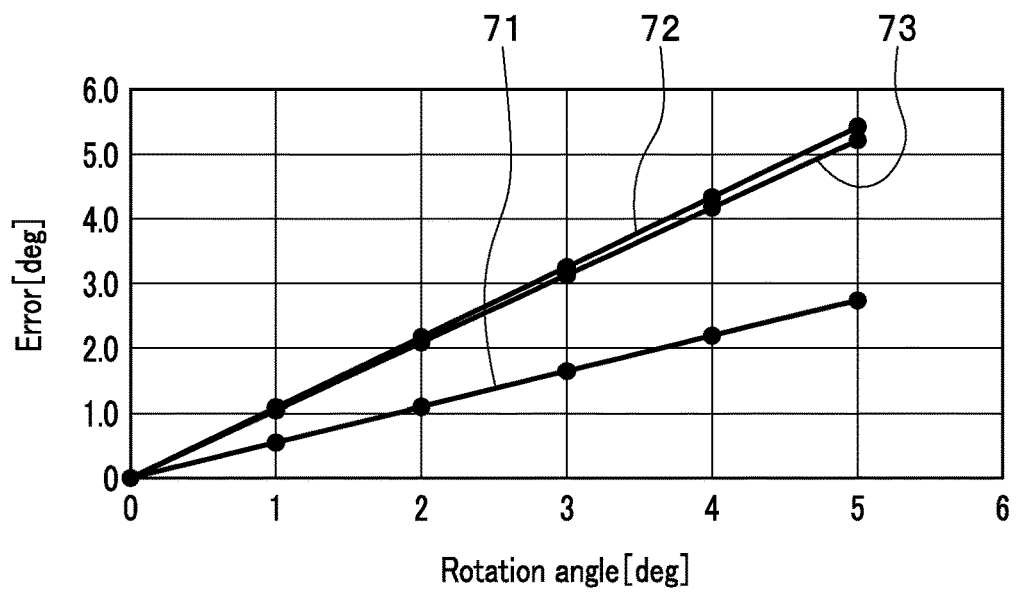
FIG. 12 is a characteristic chart showing a relationship between the rotation angle of the magnetic sensor and errors determined by a simulation.

FIG. 12 shows a relationship between the rotation angle of the magnetic sensor 2 and the error determined by the simulation. In FIG. 12, the horizontal axis represents the rotation angle of the magnetic sensor 2, and the vertical axis the error. In FIG. 12, the reference numeral 71 denotes the error of the first practical example. The reference numeral 72 denotes the error of the first comparative example. The reference numeral 73 denotes the error of the second comparative example. The errors vary periodically as the relative position changes. FIG. 12 shows differences between the maximum and minimum values of the errors varying periodically as the errors.

The greater the error, the lower the detection accuracy of the relative position. The simulation result shows that the error due to a skew of the magnetic sensor 2 can be reduced by locating the first and second resistors R11 and R12 between the third and fourth resistors R21 and R22 in the direction parallel to the Y direction. According to the present example embodiment, the occurrence of the problem that the detection accuracy of the relative position drops due to a skew of the magnetic sensor 2 can thus be suppressed by locating the first to fourth resistors R11, R12, R21, and R22 as described above.

According to the present example embodiment, the effect of a deviation of the magnetic sensor 2 in the direction parallel to the Y direction can also be reduced by locating the first to fourth resistors R11, R12, R21, and R22 as described above. For example, the magnetic sensor 2 is ideally installed so that the center of the magnetic sensor 2 in the direction parallel to the Y direction coincides with that of the magnetic field generator 3 in the direction parallel to the Y direction when viewed in the Z direction. The strength of the magnetic field component MFx peaks at the center of the magnetic field generator 3 in the direction parallel to the Y direction. If the magnetic sensor 2 is located at the foregoing ideal position, the strength of the magnetic field component MFx therefore peaks at the center of the magnetic sensor 2 in the direction parallel to the Y direction (between the first and second resistors R11 and R12). If the magnetic sensor 2 deviates from the ideal position in the direction parallel to the Y direction, the strength of the magnetic field component MFx detected by each of the first to fourth resistors R11, R12, R21, and R22 also changes.

We now focus on the first and second resistors R11 and R12 in the model of the second comparative example shown in FIG. 11. In the model of the second comparative example, if the magnetic sensor 2 deviates from the ideal position in the Y direction, both the magnetic field components MFx detected by the first and second resistors R11 and R12 decrease in strength. As a result, either one of the resistances of the first and second resistors R11 and R12 increases, and the other decreases.

The resistance of the first resistor R11 will be denoted by the symbol r11, and the resistance of the second resistor R12 by the symbol r12. In the case where the magnetic sensor 2 is driven by the constant voltage, the potential at the first output port E1 is proportional to r12/(r11+r12). If either one of r11 and r12 increases and the other decreases as described above, r12 changes greatly compared to the change of r11+r12. The potential at the first output port E1 thus deviates from that when the magnetic sensor 2 is located at the ideal position.

By contrast, according to the present example embodiment, if the magnetic sensor 2 deviates from the ideal position in the Y direction, the strength of the magnetic field component MFx detected by the first resistor R11 decreases and the strength of the magnetic field component MFx detected by the second resistor R12 increases. As a result, the resistance r11 of the first resistor R11 and the resistance r12 of the second resistor R12 both increase or both decrease. According to the present example embodiment, a change in r12/(r11+r12) can thereby be suppressed compared to the model of the second comparative example.

According to the present example embodiment, a change in the first detection signal S1 when the magnetic sensor 2 deviates from the ideal position in the direction parallel to the Y direction can thus be suppressed.

The foregoing description of the first and second resistors R11 and R12 also applies to the third and fourth resistors R21 and R22. According to the present example embodiment, a change in the second detection signal S2 when the magnetic sensor 2 deviates from the ideal position in the direction parallel to the Y direction can thus be suppressed. Consequently, according to the present example embodiment, the effect of a deviation of the magnetic sensor 2 in the direction parallel to the Y direction can be reduced. This effect is obtained in the case where the magnetic sensor 2 is driven by the constant voltage.

Next, features based on the layout of the first to fourth resistors R11, R12, R21, and R22 will be further described with reference to FIGS. 9 to 11. In FIGS. 9 to 11, the arrow denoted by the symbol D1 represents the amount of deviation between the first resistor R11 and the third resistor R21 in a direction parallel to the longitudinal direction of the magnetic field generator 3 in each model when the magnetic field generator 3 is rotated to skew by a predetermined angle clockwise in FIGS. 9 to 11 about a rotation axis parallel to the Z direction. The arrow denoted by the symbol D2 represents the amount of deviation between the second resistor R12 and the fourth resistor R22 in the direction parallel to the longitudinal direction of the magnetic field generator 3 in each model when the magnetic field generator 3 is skewed as described above. The amount of deviation refers to, for example, a distance between the corresponding ends of the two resistors. Skewing the magnetic field generator 3 as described above is equivalent to rotating the magnetic sensor 2 to skew by the predetermined angle about a rotation axis parallel to the Z direction.

If the longitudinal direction of the magnetic field generator 3 coincides with the direction parallel to the X direction, the amounts of deviation D1 and D2 are ¼ of the size Lp of one pitch, i.e., Lp/4. By contrast, if the magnetic field generator 3 is skewed as described above, the amounts of deviation D1 and D2 have values different from Lp/4. In the first practical example shown in FIG. 9, the amount of deviation D1 is smaller than Lp/4, and the amount of deviation D2 is greater than Lp/4. In the first comparative example shown in FIG. 10 and the second comparative example shown in FIG. 11, both the amounts of deviation D1 and D2 are greater than Lp/4.

Although not shown in the drawings, if the magnetic field generator 3 in each model is rotated to skew by a predetermined angle counterclockwise in FIGS. 9 to 11 about the rotation axis parallel to the Z direction, the relationship in magnitude between the amounts of deviation D1 and D2 and Lp/4 is reverse to the foregoing. Locating the first and second resistors R11 and R12 between the third and fourth resistors R21 and R22 in the direction parallel to the Y direction thus corresponds to either one of the amounts of deviation D1 and D2 increasing and the other decreasing when the magnetic sensor 2 or the magnetic field generator 3 is skewed.

Now, a signal corresponding to a potential difference between both ends of the first resistor R11 will be referred to as a first signal. A signal corresponding to a potential difference between both ends of the second resistor R12 will be referred to as a second signal. A signal corresponding to a potential difference between both ends of the third resistor R21 will be referred to as a third signal. A signal corresponding to a potential difference between both ends of the fourth resistor R22 will be referred to as a fourth signal. A phase difference between the first and third signals will be referred to as a first phase difference. A phase difference between the second and fourth signals will be referred to as a second phase difference.

If the amount of deviation D1 is Lp/4, the first phase difference is 90°. If the amount of deviation D1 is less than Lp/4, the first phase difference is less than 90°. If the amount of deviation D1 is greater than Lp/4, the first phase difference is greater than 90°. The relationship between the amount of deviation D1 and the first phase difference also applies to that between the amount of deviation D2 and the second phase difference. Suppose that the magnetic field generator 3 in each model is rotated to skew by a predetermined angle clockwise in FIGS. 9 to 11 about the rotation axis parallel to the Z direction. In such a case, in the first practical example shown in FIG. 9, the first phase difference is less than 90° and the second phase difference is greater than 90°. In the first comparative example shown in FIG. 10 and the second comparative example shown in FIG. 11, both the first and second phase differences are greater than 90°.

Suppose now that the magnetic field generator 3 in each model is rotated to skew by a predetermined angle counterclockwise in FIGS. 9 to 11 about the rotation axis parallel to the Z direction. In such a case, the relationship in magnitude between the first and second phase differences and 90° is reverse to the foregoing. Locating the first and second resistors R11 and R12 between the third and fourth resistors R21 and R22 in the direction parallel to the Y direction thus corresponds to either one of the first and second phase differences being less than 90° and the other being greater than 90° when the magnetic sensor 2 or the magnetic field generator 3 is skewed.

Next, the other effects of the present example embodiment will be described by comparison with a magnetic encoder according to a third comparative example. A configuration of the magnetic encoder according to the third comparative example will initially be described. The magnetic encoder according to the third comparative example has basically the same configuration as that of the magnetic encoder 1 according to the present example embodiment. However, in the third comparative example, the magnetization directions of the magnetization pinned layers in all the MR elements 50 included in the first to fourth resistors R11, R12, R21, and R22 are the same (for example, −X direction). Moreover, in the third comparative example, the second resistor R12 is located at a position Lp/2 away from the first resistor R11 in the X direction. The fourth resistor R22 is located at a position Lp/2 away from the third resistor R21 in the X direction.

The amount of deviation between the first resistor R11 and the second resistor R12 in the direction parallel to the longitudinal direction of the magnetic field generator 3 will be referred to as a first amount of deviation. The amount of deviation between the third resistor R21 and the fourth resistor R22 in the direction parallel to the longitudinal direction of the magnetic field generator 3 will be referred to as a second amount of deviation. If the longitudinal direction of the magnetic field generator 3 coincides with the direction parallel to the X direction, both the first and second amounts of deviation are Lp/2. If the magnetic field generator 3 is rotated to skew by a predetermined angle about a rotation axis parallel to the Z direction, the first and second amounts of deviation are both greater than Lp/2 or both smaller than Lp/2. In such a case, offsets occur in the first and second detection signals S1 and S2.

By contrast, in the present example embodiment, the center of gravity C11 of the first resistor R11 when viewed in the Z direction and the center of gravity C12 of the second resistor R12 when viewed in the Z direction are located at positions symmetrical about the imaginary straight line L. The center of gravity C21 of the third resistor R21 when viewed in the Z direction and the center of gravity C22 of the fourth resistor R22 when viewed in the Z direction are located at positions symmetrical about the imaginary straight line L. In the present example embodiment, if the longitudinal direction of the magnetic field generator 3 coincides with the direction parallel to the X direction, both the first and second amounts of deviation are 0. If the magnetic field generator 3 is rotated to skew by a predetermined angle about the rotation axis parallel to the Z direction, both the first and second amounts of deviation change by an amount smaller than in the third comparative example. Consequently, according to the present example embodiment, the offsets of the first and second detection signals S1 and S2 when the magnetic sensor 2 or the magnetic field generator 3 is skewed can be reduced, compared to the third comparative example.

In the present example embodiment, the magnetization directions of the magnetization pinned layers in the respective plurality of MR elements 50 included in the first and third resistors R11 and R21 are the −X direction. The magnetization directions of the magnetization pinned layers in the respective plurality of MR elements 50 included in the second and fourth resistors R12 and R22 are the X direction. According to the present example embodiment, the first to fourth resistors R11, R12, R21, and R22 can thus be arranged in the foregoing positional relationship. Such a positional relationship between the centers of gravity C11, C12, C21, and C22 corresponds to two resistors whose magnetization pinned layers have respective different magnetization directions being located at positions symmetrical about the imaginary straight line L.

According to the present example embodiment, the dimension of the magnetic sensor 2 in the direction parallel to the X direction can be made smaller than in the third comparative example by arranging the first to fourth resistors R11, R12, R21, and R22 in the foregoing positional relationship.

In the present example embodiment, the center of gravity C1 of the group RA including the first and third resistors R11 and R21 when viewed in the Z direction and the center of gravity C2 of the group RB including the second and fourth resistors R12 and R22 when viewed in the Z direction are located at positions symmetrical about the imaginary straight line L. According to the present example embodiment, the dimension of the magnetic sensor 2 in the direction parallel to the X direction can thus be reduced, compared to the case where the groups RA and RB are arranged along the direction parallel to the X direction. The foregoing positional relationship between the centers of gravity C1 and C2 corresponds to the two resistors connected to the power supply port V1 (first and third resistors R11 and R21) and the two resistors connected to the ground port G1 (second and fourth resistors R12 and R22) being located at positions symmetrical about the imaginary straight line L.

In the present example embodiment, as described above, the first to fourth resistors R11, R12, R21, and R22 are configured to reduce the error components corresponding to harmonics of the ideal components. According to the present example embodiment, the detection accuracy of the relative position can thus be improved. In addition, according to the present example embodiment, the dimension of the magnetic sensor 2 in the direction parallel to the X direction can be reduced while improving the detection accuracy of the relative position.

Now, description will be made on a result of an experiment that examined the error components corresponding to the harmonics of the ideal components. In the experiment, a magnetic encoder of a second practical example and a magnetic encoder of a fourth comparative example were fabricated. The magnetic encoder of the second practical example has the same configuration as that of the magnetic encoder 1 according to the example embodiment.

The magnetic encoder of the fourth comparative example has the same configuration as that of the magnetic encoder 1 according to the example embodiment except a configuration of a plurality of element groups. In the magnetic encoder of the fourth comparative example, the first to fourth resistors R11, R12, R21, and R22 of the magnetic sensor 2 each include only the element group 31 among the element groups 31 to 38 shown in FIG. 6. It can be said that, unlike the magnetic encoder of the second practical example (the magnetic encoder 1 according to the example embodiment), the magnetic encoder of the fourth comparative example is not configured to be capable of reducing the error component corresponding to the third harmonic (third-order harmonic), the error component corresponding to the fifth harmonic (fifth-order harmonic), and the error component corresponding to the seventh harmonic (seventh-order harmonic), the error components being included in each of the first and second detection signals S1 and S2.

In the experiment, first, in each of the magnetic encoder of the second practical example and the magnetic encoder of the fourth comparative example, the position of the magnetic field generator 3 relative to the magnetic sensor 2 was changed so that the value of each of the first and the second detection signals S1 and S2 is changed by one period or more. For the magnetic encoder of the second practical example, the first and second detection signals S1 and S2 in the case of constant current driving of the magnetic sensor 2, and the first and second detection signals S1 and S2 in the case of constant voltage driving of the magnetic sensor 2 were acquired. For the magnetic encoder of the fourth comparative example, the first and second detection signals S1 and S2 in the case of constant voltage driving of the magnetic sensor 2 were acquired.

In the experiment, next, a component, the signal period of which coincides with the signal period of the ideal component (hereinafter, referred to as a first-order component), an error component corresponding to the third harmonic (hereinafter, referred to as a third-order component), an error component corresponding to the fifth harmonic (hereinafter, referred to as a fifth-order component), and an error component corresponding to the seventh harmonic (hereinafter, referred to as a seventh-order component) were extracted from each of the acquired first and second detection signals S1 and S2. Then, an amplitude of each of the first-order component, the third-order component, the fifth-order component, and the seventh-order component was obtained. Next, the amplitude of each of the first-order component, the third-order component, the fifth-order component, and the seventh-order component was standardized so that the amplitude of the first-order component becomes 100%. In the following description, the term "amplitude" refers to each of the standardized amplitudes.

Table 1 shows the respective amplitudes of the third-order component, the fifth-order component, and the seventh-order component. The amplitudes of the third-order component (the fifth-order component, the seventh-order component) shown in Table 1 are average values of the amplitudes of the third-order components (the fifth-order components, the seventh-order components) extracted from the respective first and second detection signals S1 and S2. From Table 1 it is seen that, in both of the cases of the constant current driving and the constant voltage driving, the respective amplitudes of the third-order component, the fifth-order component, and the seventh-order component of the magnetic encoder of the second practical example are smaller than those of the third-order component, the fifth-order component, and the seventh-order component of the magnetic encoder of the fourth comparative example. As understood from this result, according to the example embodiment, the error components corresponding to the harmonics of the ideal components can be reduced in both of the cases of the constant current driving and the constant voltage driving.

TABLE 1

|  | Second practical example | | Fourth comparative example |
| --- | --- | --- | --- |
|  | Constant current drive | Constant voltage drive | Constant voltage drive |
| Third-order component | 0.25% | 0.26% | 2.94% |
| Fifth-order component | 0.05% | 0.05% | 0.20% |
| Seventh-order component | 0.05% | 0.05% | 0.17% |

In terms of reducing the error components corresponding to the odd-ordered harmonic components, the magnetic sensor 2 may be driven by the constant voltage or driven by the constant current.

Figure 13:
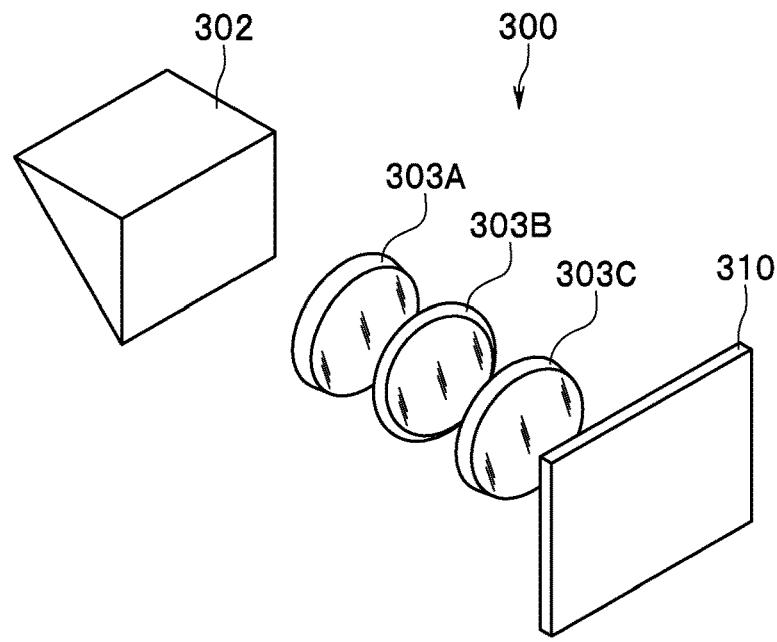
FIG. 13 is a perspective view showing a lens module including a position detection device according to the first example embodiment of the technology.
Figure 14:
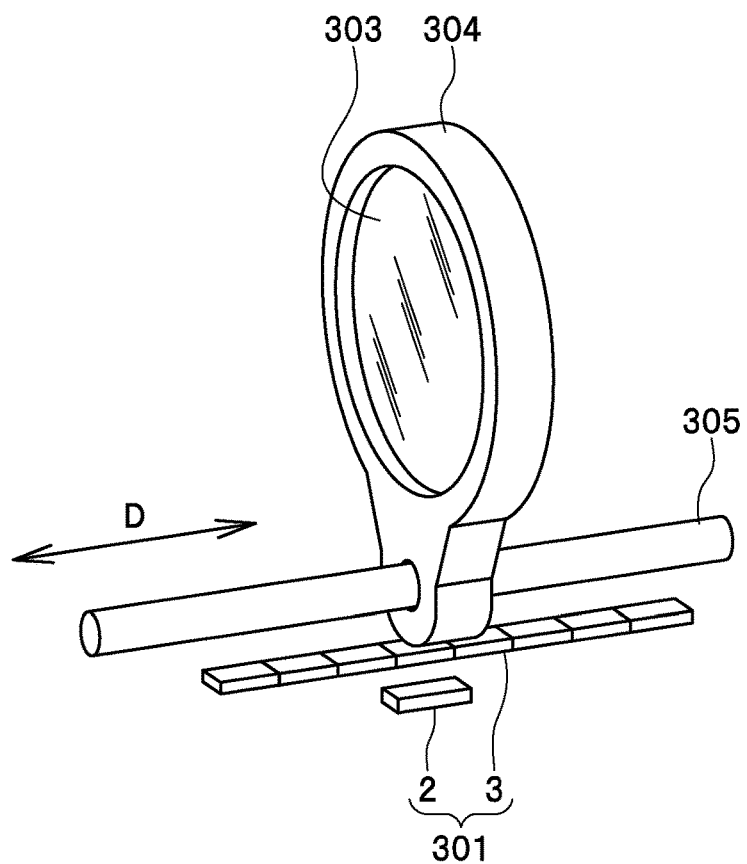
FIG. 14 is a perspective view showing the position detection device according to the first example embodiment of the technology.

Next, a lens position detection device (hereinafter, referred to simply as a position detection device) according to the present example embodiment will be described with reference to FIGS. 13 and 14. FIG. 13 is a perspective view showing a lens module including the position detection device according to the present example embodiment. FIG. 14 is a perspective view showing the position detection device according to the present example embodiment.

A lens module 300 shown in FIG. 13 constitutes a part of a smartphone camera, for example. The lens module 300 is used in combination with an image sensor 310 using a complementary metal-oxide-silicon (CMOS) sensor or the like. In the example shown in FIG. 13, the lens module 300 includes a triangular prism 302, and three lenses 303A, 303B, and 303C located between the image sensor 310 and the prism 302. At least one of the lenses 303A, 303B, and 303C is configured to be movable by a not-shown driving unit so that at least either focusing or zooming can be performed.

FIG. 14 shows a lens 303 among the lenses 303A, 303B, and 303C. The lens module 300 further includes a lens holder 304 that holds the lens 303, and a shaft 305. The lens module 300 can change the position of the lens 303 in an optical axis direction of the lens 303 by using the lens holder 304, the shaft 305, and the not-shown driving unit. In FIG. 14, the arrow denoted by the symbol D indicates the moving direction of the lens 303.

The lens module 300 further includes a position detection device 301 for detecting the position of the lens 303 whose position is variable. The position detection device 301 is used to detect the position of the lens 303 in performing focusing or zooming.

The position detection device 301 is a magnetic position detection device, and includes the magnetic sensor 2 according to the present example embodiment and the magnetic field generator 3 of the present example embodiment. In the lens module 300, the magnetic sensor 2 and the magnetic field generator 3 are configured so that the strength of the magnetic field component MFx (see FIG. 2) changes as the position of the lens 303 changes in the moving direction D. Specifically, the magnetic sensor 2 is fixed, and the magnetic field generator 3 is configured to be movable with the lens 303 in the moving direction D. The moving direction D is parallel to the X direction shown in FIGS. 1 and 2. When the position of the lens 303 changes, the position of the magnetic field generator 3 relative to the magnetic sensor 2 thus changes, and as a result, the strength of the magnetic field component MFx changes.

The position detection device 301 further includes the detection value generation circuit 4 of the present example embodiment (see FIG. 4). The position detection device 301 generates a detection value Vs having a correspondence with the position of the lens 303 on the basis of the first and second detection signals S1 and S2 generated by the magnetic sensor 2. The position of the lens 303 has a correspondence with the position of the magnetic field generator 3 relative to the magnetic sensor 2. The method for generating the detection value Vs by the position detection device 301 is the same as the foregoing method for generating the detection value Vs.

Next, a manufacturing method for the magnetic sensor 2 according to the example embodiment will be briefly described. The manufacturing method for the magnetic sensor 2 includes a step of forming a plurality of MR elements 50. The step of forming the plurality of MR elements 50 includes a step of forming a plurality of layered films 50A. In the step of forming the plurality of layered films 50A, a plurality of initial layered films to later become the plurality of layered films 50A are initially formed. Each of the plurality of initial layered films includes an initial magnetization pinned layer to later become the magnetization pinned layer 51, the free layer 53, and the gap layer 52.

Next, the magnetization directions of the initial magnetization pinned layers are fixed to predetermined directions using laser light and external magnetic fields in the foregoing predetermined directions. For example, a plurality of initial layered films to later become the plurality of layered films 50A of the plurality of MR elements 50 constituting the first and third resistors R11 and R21 are irradiated with laser light while an external magnetic field in the first magnetization direction (−X direction) is applied thereto. When the irradiation with the laser light is completed, the magnetization directions of the initial magnetization pinned layers are fixed to the first magnetization direction. This makes the initial magnetization pinned layers into the magnetization pinned layers 51, and the initial layered films into the layered films 50A. In a plurality of initial layered films to later become the plurality of layered films 50A of the plurality of MR elements 50 constituting the second and fourth resistors R12 and R22, the magnetization direction of the initial magnetization pinned layer in each of the plurality of initial layered films can be fixed to the second magnetization direction (X direction) by setting the direction of the external magnetic field to the second magnetization direction. The plurality of layered films 50A are formed in such a manner.

Modification Examples

Figure 15:
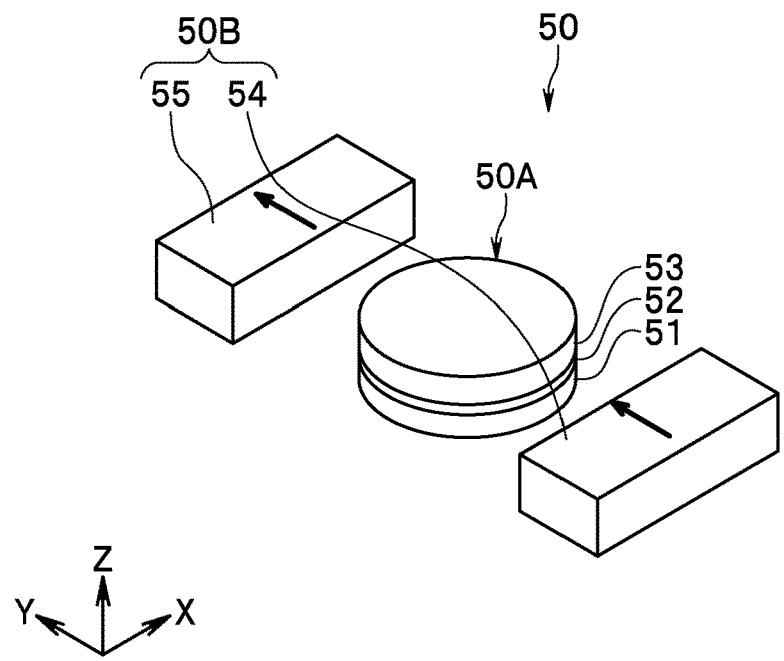
FIG. 15 is a perspective view showing a first modification example of a magnetoresistive element of the first example embodiment of the technology.

Next, first to fifth modification examples of the MR element 50 of the present example embodiment will be described. The first modification example of the MR element 50 will initially be described with reference to FIG. 15. The first modification example of the MR element 50 has basically the same configuration as that of the first example of the MR element 50 shown in FIG. 7. However, in the first modification example, the layered film 50A has a circular or substantially circular planar shape when viewed in the Z direction.

Figure 16:
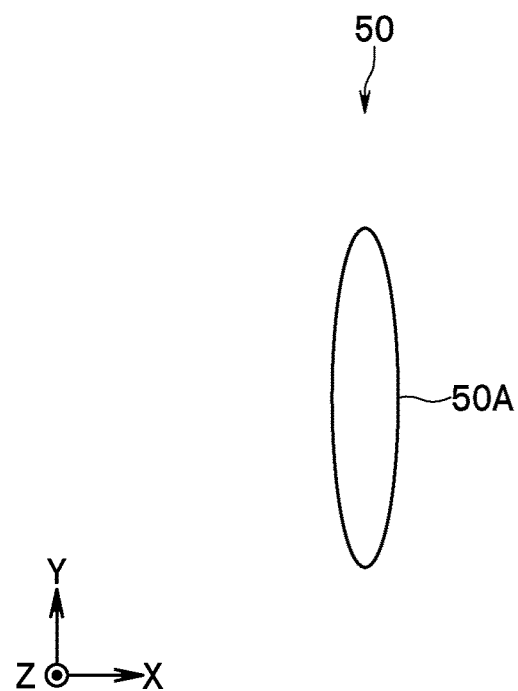
FIG. 16 is a plan view showing a second modification example of the magnetoresistive element of the first example embodiment of the technology.

Next, the second modification example of the MR element 50 will be described with reference to FIG. 16. The second modification example is different from the first modification example in the following points. The second modification example does not include the bias magnetic field generator 50B. In the second modification example, the planar shape of the layered film 50A when viewed in the Z direction is an ellipse whose major axis direction intersects the direction parallel to the X direction. The free layer 53 of the MR element 50 has magnetic shape anisotropy with the direction of the easy axis of magnetization intersecting the X direction. In the example shown in FIG. 16, the direction of the easy axis of magnetization is parallel to the Y direction. The direction of the easy axis of magnetization may be oblique to the Y direction.

Figure 17:
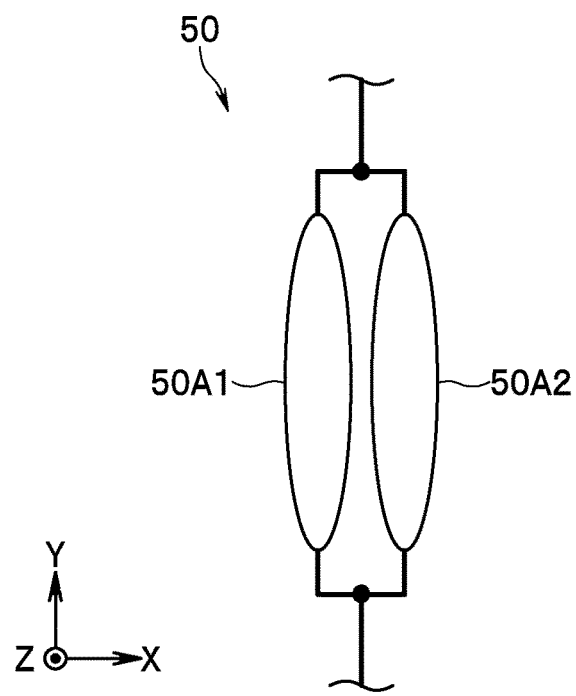
FIG. 17 is a plan view showing a third modification example of the magnetoresistive element of the first example embodiment of the technology.

Next, the third modification example of the MR element 50 will be described with reference to FIG. 17. The third modification example is different from the second modification example in the following points. In the third modification example, the MR element 50 includes two layered films 50A1 and 50A2 instead of the layered film 50A according to the second modification example. The layered films 50A1 and 50A2 each have the same configuration and shape as those of the layered film 50A according to the second modification example. The layered films 50A1 and 50A2 are connected in parallel by electrodes to constitute a layered film pair. The layered film pair is connected to the layered film pair of another MR element 50 in series by an electrode. For example, the bottom surfaces of the respective layered films 50A1 and 50A2 are electrically connected to the bottom surfaces of the respective layered films 50A1 and 50A2 of another MR element 50 by a not-shown lower electrode. The top surfaces of the respective layered films 50A1 and 50A2 are electrically connected to the top surfaces of the respective layered films 50A1 and 50A2 of yet another MR element 50 by a not-shown upper electrode.

Figure 18:
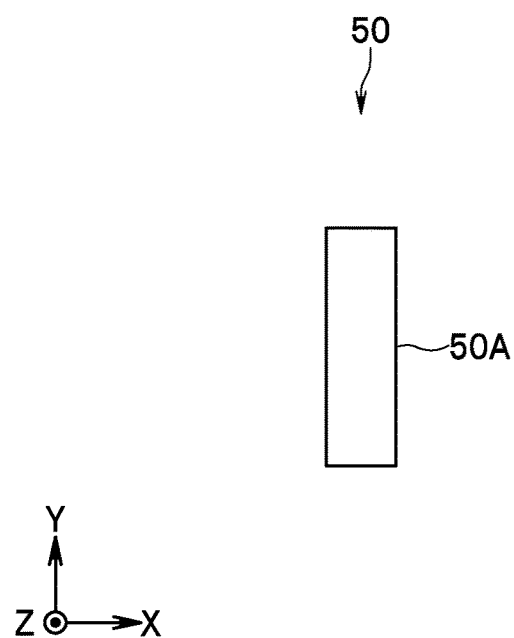
FIG. 18 is a plan view showing a fourth modification example of the magnetoresistive element of the first example embodiment of the technology.

Next, the fourth modification example of the MR element 50 will be described with reference to FIG. 18. The fourth modification example is different from the second modification example in the following points. The planar shape of the layered film 50A when viewed in the Z direction is a rectangle whose longitudinal direction intersects the direction parallel to the X direction. The free layer 53 of the MR element 50 has magnetic shape anisotropy with the direction of the easy axis of magnetization intersecting the X direction. In the example shown in FIG. 18, the direction of the easy axis of magnetization is parallel to the Y direction. The direction of the easy axis of magnetization may be oblique to the Y direction.

Figure 19:
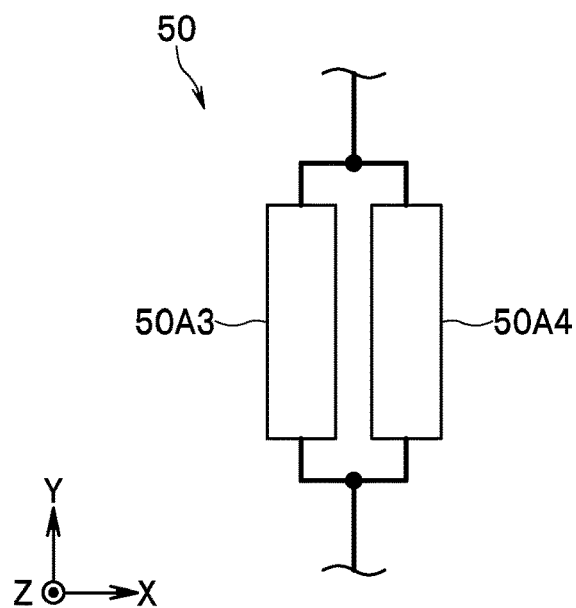
FIG. 19 is a plan view showing a fifth modification example of the magnetoresistive element of the first example embodiment of the technology.

Next, the fifth modification example of the MR element 50 will be described with reference to FIG. 19. The fifth modification example is constituted by replacing the layered films 50A1 and 50A2 according to the third modification example with two layered films 50A3 and 50A4 having the same configuration and shape as those of the layered film 50A according to the fourth modification example. The layered films 50A3 and 50A4 are connected in parallel by electrodes to constitute a layered film pair. The layered film pair is connected to the layered film pair of another MR element 50 in series by an electrode.

Second Example Embodiment

Figure 20:
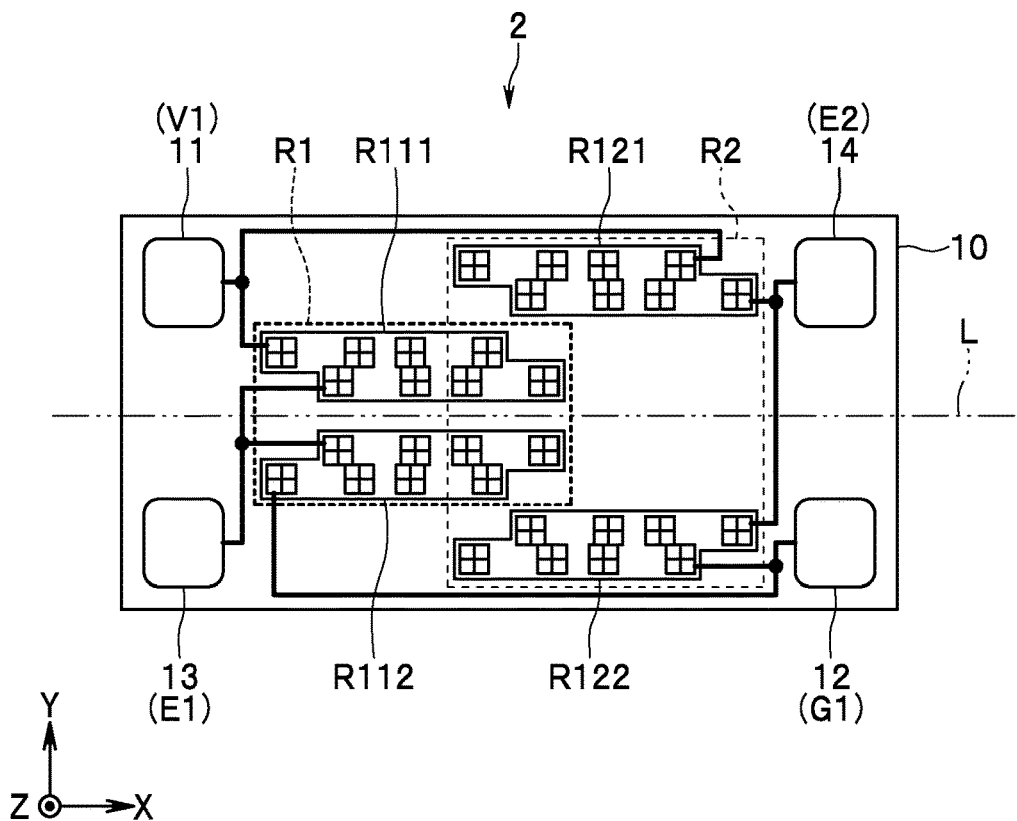
FIG. 20 is a plan view showing a magnetic sensor according to a second example embodiment of the technology.
Figure 21:
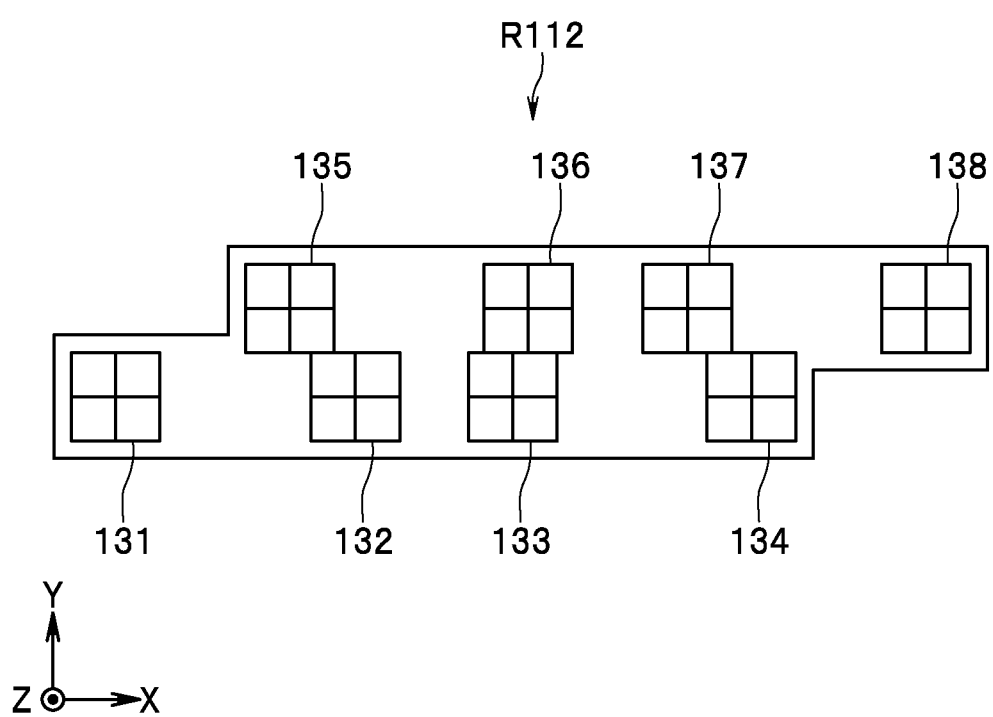
FIG. 21 is a plan view showing a second resistor of the second example embodiment of the technology.

A second example embodiment of the technology will now be described with reference to FIGS. 20 and 21. FIG. 20 is a plan view showing a magnetic sensor of the present example embodiment. FIG. 21 is a plan view showing a second resistor of the present example embodiment.

The magnetic sensor 2 according to the present example embodiment differs from that according to the first example embodiment in the following ways. The magnetic sensor 2 according to the present example embodiment includes a first resistor R111, a second resistor R112, a third resistor R121, and a fourth resistor R122 instead of the first to fourth resistors R11, R12, R21, and R22 of the first example embodiment. The first to fourth resistors R111, R112, R121, and R122 are each configured to change in resistance with the strength of the magnetic field component MFx (see FIG. 2). The layout of the first to fourth resistors R111, R112, R121, and R122 in circuit diagram and the layout of the first to fourth resistors R111, R112, R121, and R122 in physical configuration are the same as those of the first to fourth resistors R11, R12, R21, and R22 of the first example embodiment.

The first to fourth resistors R111, R112, R121, and R122 each include a plurality of MR elements 50. The first to fourth resistors R111, R112, R121, and R122 also each include a plurality of element groups. For the plurality of element groups, the first and third resistors R111 and R121 each include eight element groups 31 to 38 having the configuration and positional relationship shown in FIG. 6 in the first example embodiment.

FIG. 21 is a plan view showing the second resistor R112. As shown in FIG. 21, the second resistor R112 includes eight element groups 131, 132, 133, 134, 135, 136, 137, and 138. The element groups 131 to 138 each have the same configuration as that of each of the element groups 31 to 38. The element groups 131 to 134 have the same positional relationship as that of the element groups 31 to 34. The element groups 135 to 138 have the same positional relationship as that of the element groups 35 to 38. In particular, in the second resistor R112, the element groups 135 to 138 are located along the X direction, anterior to the element groups 131 to 134 in the Y direction.

The plurality of element groups in the fourth resistor R122 have the same configuration and layout as those of the plurality of element groups in the second resistor R112. Specifically, the fourth resistor R122 includes eight element groups 131 to 138 having the configuration and positional relationship shown in FIG. 21.

In FIG. 20, the symbol L denotes an imaginary straight line parallel to the X direction. In FIG. 20, the element groups 31 to 38 and 131 to 138 are represented by rectangles divided in four sections like the element groups 31 to 38 in FIG. 6 and the element groups 131 to 138 in FIG. 21. In particular, in the present example embodiment, as shown in FIG. 20, the element groups 31 to 38 of the first resistor R111 and the element groups 131 to 138 of the second elements R112 are located at positions symmetrical about the imaginary straight line LI. The plurality of MR elements 50 of the first resistor R11 and the plurality of MR elements 50 of the second resistor R112 are located at positions symmetrical about the imaginary straight line L. The element groups 31 to 38 of the third resistor R121 and the element groups 131 to 138 of the fourth elements R122 are located at positions symmetrical about the imaginary straight line LI. The plurality of MR elements 50 of the third resistor R121 and the plurality of MR elements 50 of the fourth resistor R122 are located at positions symmetrical about the imaginary straight line L.

As described above, in the present example embodiment, a plurality of MR elements 50 included in two resistors connected in series are located at positions symmetrical about the imaginary straight line L. According to the present example embodiment, the offsets of the first and second detection signals S1 and S2 when the magnetic sensor 2 or the magnetic field generator 3 is skewed can thus be reduced, compared to the magnetic encoder of the third comparative example described in the first example embodiment.

The configuration, operation and effects of the present example embodiment are otherwise the same as those of the first example embodiment.

Third Example Embodiment

Figure 22:
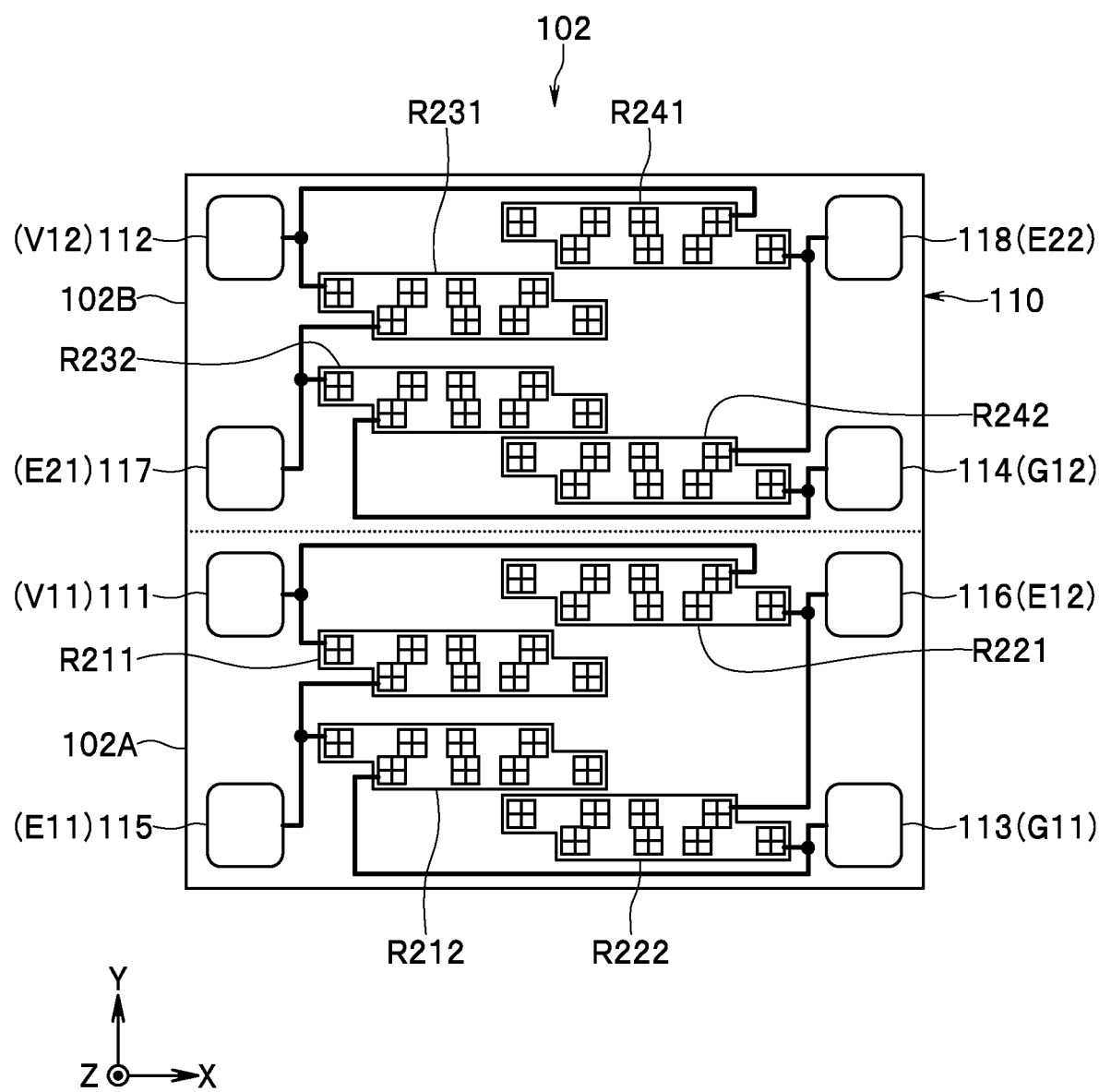
FIG. 22 is a plan view showing a magnetic sensor according to a third example embodiment of the technology.
Figure 23:
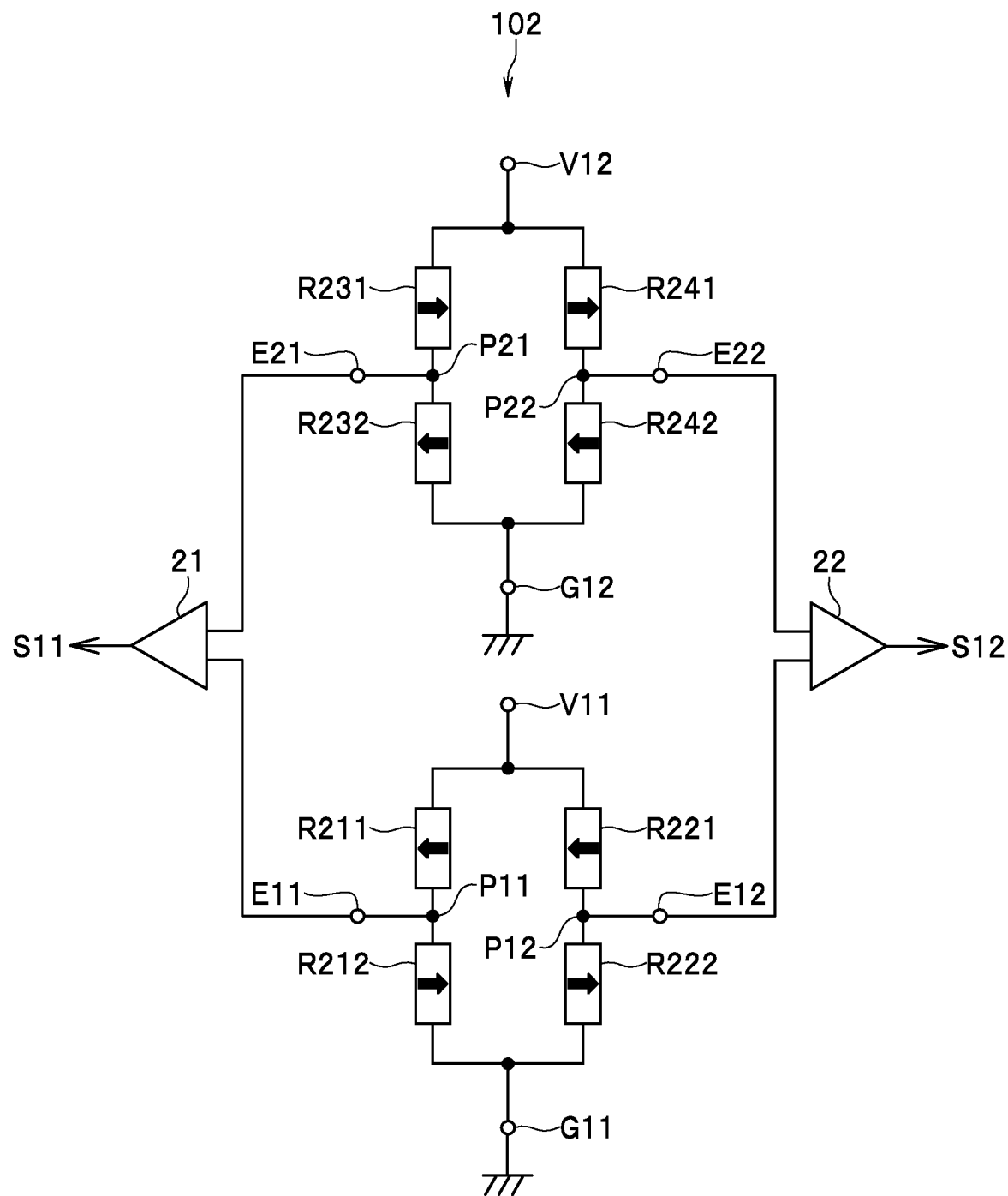
FIG. 23 is a circuit diagram showing the configuration of the magnetic sensor according to the third example embodiment of the technology.

A third example embodiment of the technology will now be described with reference to FIGS. 22 and 23. FIG. 22 is a plan view showing a magnetic sensor according to the present example embodiment. FIG. 23 is a circuit diagram showing the configuration of the magnetic sensor according to the present example embodiment.

The magnetic sensor 102 according to the present example embodiment includes a first resistor R211, a second resistor R212, a third resistor R221, a fourth resistor R222, a fifth resistor R231, a sixth resistor R232, a seventh resistor R241, and an eighth resistor R242 each configured to change in resistance with the strength of the magnetic field component MFx (see FIG. 2). The first to eighth resistors R211, R212, R221, R222, R231, R232, R241, and R242 each include a plurality of MR elements 50. The first to eighth resistors R211, R212, R221, R222, R231, R232, R241, and R242 each include eight element groups 31 to 38 having the configuration and positional relationship shown in FIG. 6 in the first example embodiment.

The magnetic sensor 102 further includes two power supply ports V11 and V12, two ground ports G11 and G12, a first output port E11, a second output port E12, a third output port E21, a fourth output port E22, and two differential detectors 21 and 22. The ground ports G11 and G12 are grounded. The magnetic sensor 102 may be driven by a constant voltage or driven by a constant current. In the case where the magnetic sensor 102 is driven by a constant voltage, a voltage of predetermined magnitude is applied to each of the power supply ports V11 and V12. In the case where the magnetic sensor 102 is driven by a constant current, a current of predetermined magnitude is supplied to each of the power supply ports V11 and V12.

The differential detector 21 outputs a signal corresponding to a potential difference between the first and third output ports E11 and E21 as a first detection signal S11. The differential detector 22 outputs a signal corresponding to a potential difference between the second and fourth output ports E12 and E22 as a second detection signal S12.

The differential detectors 21 and 22 are connected to the detection value generation circuit 4 (see FIG. 4). In the present example embodiment, the detection value generation circuit 4 generates the detection value Vs on the basis of the first and second detection signals S11 and S12. At least either the magnetic sensor 102 or the detection value generation circuit 4 may be configured to be able to correct the amplitude, phase, and offset of each of the first and second detection signals S11 and S12. The method for generating the detection value Vs is the same as that of the first example embodiment except that the first and second detection signals S11 and S12 are used instead of the first and second detection signals S1 and S2.

As shown in FIG. 23, the first resistor R211 and the second resistor R212 are connected in series via a first connection point P11 connected to the first output port E11. The third resistor R221 and the fourth resistor R222 are connected in series via a second connection point P12 connected to the second output port E12. The fifth resistor R231 and the sixth resistor R232 are connected in series via a third connection point P21 connected to the third output port E21. The seventh resistor R241 and the eighth resistor R242 are connected in series via a fourth connection point P22 connected to the fourth output port E22.

In circuit configuration, the first resistor R211 is located between the power supply port V11 and the first connection point P11. An end (end in the circuit diagram) of the first resistor R211 opposite to the first connection point P11 is connected to the power supply port V11.

In circuit configuration, the second resistor R212 is located between the ground port G11 and the first connection point P11. An end (end in the circuit diagram) of the second resistor R212 opposite to the first connection point P11 is connected to the ground port G11.

In circuit configuration, the third resistor R221 is located between the power supply port V11 and the first connection point P12. An end (end in the circuit diagram) of the third resistor R221 opposite to the second connection point P12 is connected to the power supply port V11.

In circuit configuration, the fourth resistor R222 is located between the ground port G11 and the second connection point P12. An end (end in the circuit diagram) of the fourth resistor R222 opposite to the second connection point P12 is connected to the ground port G11.

In circuit configuration, the fifth resistor R231 is located between the power supply port V12 and the third connection point P21. An end (end in the circuit diagram) of the fifth resistor R231 opposite to the third connection point P21 is connected to the power supply port V12.

In circuit configuration, the sixth resistor R232 is located between the ground port G12 and the third connection point P21. An end (end in the circuit diagram) of the sixth resistor R232 opposite to the third connection point P21 is connected to the ground port G12.

In circuit configuration, the seventh resistor R241 is located between the power supply port V12 and the fourth connection point P22. An end (end in the circuit diagram) of the seventh resistor R241 opposite to the fourth connection point P22 is connected to the power supply port V12.

In circuit configuration, the eighth resistor R242 is located between the ground port G12 and the fourth connection point P22. An end (end in the circuit diagram) of the eighth resistor R242 opposite to the fourth connection point P22 is connected to the ground port G12.

As shown in FIG. 22, the magnetic sensor 102 further includes a substrate 110, and two power supply terminals 111 and 112, two ground terminals 113 and 114, a first output terminal 115, a second output terminal 116, a third output terminal 117, and a fourth output terminal 118 that are located on the substrate 110. The power supply terminals 111 and 112 constitute the power supply ports V11 and V12, respectively. The ground terminals 113 and 114 constitute the ground ports G11 and G12, respectively. The first to fourth output terminals 115, 116, 117, and 118 constitute the first to fourth output ports E11, E12, E21, and E22, respectively.

As shown in FIG. 22, the magnetic sensor 102 is divided between a first portion 102A and a second portion 102B. In FIG. 22, the border between the first and second portions 102A and 102B is shown by a dotted line. The second portion 102B is located in front of the first portion 102A in the Y direction. The first portion 102A includes the first to fourth resistors R211, R212, R221, and R222, the power supply terminal 111, the ground terminal 113, and the first and second output terminals 115 and 116. The second portion 102B includes the fifth to eighth resistors R231, R232, R241, and R242, the power supply terminal 112, the ground terminal 114, and the third and fourth output terminals 117 and 118.

The layout of the first to fourth resistors R211, R212, R221, and R222 in the first portion 102A is the same as that of the first to fourth resistors R11, R12, R21, and R22 of the first example embodiment. The layout of the fifth to eighth resistors R231, R232, R241, and R242 in the second portion 102B is also the same as that of the first to fourth resistors R11, R12, R21, and R22 of the first example embodiment. In particular, in the present example embodiment, the fifth and sixth resistors R231 and R232 are located at the same position as the first and second resistors R211 and R212 are in the X direction. The seventh and eighth resistors R241 and R242 are located at the same position as the third and fourth resistors R221 and R222 are in the X direction.

The configuration of the first to eighth resistors R211, R212, R221, R222, R231, R232, R241, and R242 described above makes a phase difference of the ideal component of the second detection signal S12 from the ideal component of the first detection signal S11 an odd number of times ¼ of a predetermined signal period (the signal period of the ideal component).

Each of the second, fourth, sixth, and eighth resistors R212, R222, R232, and R242 may include eight element groups 131 to 138 having the configuration and positional relationship shown in FIG. 21 instead of the eight element groups 31 to 38 having the configuration and positional relationship shown in FIG. 6 in the first example embodiment. The configuration, operation and effects of the present example embodiment are otherwise the same as those of the first or second example embodiment.

The technology is not limited to the foregoing example embodiments, and various modifications may be made thereto. For example, the number and layout of the MR elements 50 are not limited to the examples described in the example embodiments but may be freely set as long as the requirements set forth in the claims are satisfied.

The magnetic field generator 3 may be a rotary scale magnetized to a plurality of pairs of N and S poles along the direction of rotation. The rotary scale may be a ring-shaped magnet, or a magnetic medium, such as a magnetic tape, fixed to a ring or a disc.

In the third example embodiment, the first portion 102A and the second portion 102B may be separated. In the third example embodiment, the resistors R211, R212, R231, and R232 may constitute a first Wheatstone bridge circuit, and the resistors R221, R222, R241, and R242 may constitute a second Wheatstone bridge circuit. In such a case, the first and second Wheatstone bridges may be driven by a constant voltage or driven by a constant current.

Obviously, many modifications and variations of the technology are possible in the light of the above teachings. Thus, it is to be understood that, within the scope of the appended claims and equivalents thereof, the technology may be practiced in other embodiments than the foregoing example embodiments.

What is claimed is:

1. A magnetic sensor for detecting a target magnetic field including a magnetic field component in a first direction parallel to an imaginary straight line, the magnetic sensor comprising:
   first to fourth resistors each configured to change in resistance with strength of the magnetic field component;
   a power supply port to which a current of predetermined magnitude is supplied;
   a ground port that is grounded;
   a first output port; and
   a second output port, wherein
   the first resistor and the second resistor are located in a first region and connected in series via a first connection point connected to the first output port,
   the third resistor and the fourth resistor are located in a second region and connected in series via a second connection point connected to the second output port, at least a part of the second region being located at a position different from the first region in the first direction,
   an end of the first resistor opposite to the first connection point and an end of the third resistor opposite to the second connection point are connected to the power supply port,
   an end of the second resistor opposite to the first connection point and an end of the fourth resistor opposite to the second connection point are connected to the ground port, and
   the first and second resistors are located between the third and fourth resistors in a second direction orthogonal to the first direction.

2. The magnetic sensor according to claim 1, wherein:
   a center of gravity of the first resistor when viewed in a third direction orthogonal to the first and second directions and a center of gravity of the second resistor when viewed in the third direction are located at positions symmetrical about the imaginary straight line; and
   a center of gravity of the third resistor when viewed in the third direction and a center of gravity of the fourth resistor when viewed in the third direction are located at positions symmetrical about the imaginary straight line.

3. The magnetic sensor according to claim 1, wherein a center of gravity of a group including the first and third resistors when viewed in a third direction orthogonal to the first and second directions and a center of gravity of a group including the second and fourth resistors when viewed in the third direction are located at positions symmetrical about the imaginary straight line.

4. The magnetic sensor according to claim 1, wherein:
   the first to fourth resistors each include a plurality of magnetoresistive elements; and
   the plurality of magnetoresistive elements each include a magnetization pinned layer having a magnetization whose direction is fixed, a free layer having a magnetization whose direction is variable depending on the direction and the strength of the magnetic field component, and a gap layer located between the magnetization pinned layer and the free layer.

5. The magnetic sensor according to claim 4, wherein:
   the direction of the magnetization of the magnetization pinned layer in each of the plurality of magnetoresistive elements included in the first and third resistors is a first magnetization direction; and
   the direction of the magnetization of the magnetization pinned layer in each of the plurality of magnetoresistive elements included in the second and fourth resistors is a second magnetization direction opposite to the first magnetization direction.

6. The magnetic sensor according to claim 4, wherein:
   the plurality of magnetoresistive elements of the first resistor and the plurality of magnetoresistive elements of the second resistor are located at positions symmetrical about the imaginary straight line; and
   the plurality of magnetoresistive elements of the third resistor and the plurality of magnetoresistive elements of the fourth resistor are located at positions symmetrical about the imaginary straight line.

7. The magnetic sensor according to claim 4, wherein each of the plurality of magnetoresistive elements further includes a bias magnetic field generator that generates a bias magnetic field in a direction intersecting the first direction, the bias magnetic field being applied to the free layer.

8. The magnetic sensor according to claim 4, wherein the free layer has magnetic shape anisotropy with a direction of an easy axis of magnetization intersecting the first direction.

9. The magnetic sensor according to claim 4, wherein the gap layer is a tunnel barrier layer.

10. A magnetic encoder comprising:
    the magnetic sensor according to claim 1; and
    a magnetic field generator that generates the target magnetic field, wherein
    the magnetic sensor and the magnetic field generator are configured so that the strength of the magnetic field component changes with a change in a position of the magnetic field generator relative to the magnetic sensor.

11. The magnetic encoder according to claim 10, further comprising a detection value generation circuit, wherein:
    the magnetic sensor generates a first detection signal having a correspondence with a potential at the first output port, and generates a second detection signal having a correspondence with a potential at the second output port; and
    the detection value generation circuit generates a detection value having a correspondence with the position of the magnetic field generator relative to the magnetic sensor on a basis of the first and second detection signals.

12. The magnetic encoder according to claim 11, wherein:
    the magnetic field generator is a magnetic scale including a plurality of pairs of N and S poles alternately arranged in a predetermined direction;
    the first and second detection signals each contain an ideal component varying periodically to trace an ideal sinusoidal curve, and an error component corresponding to a harmonic of the ideal component; and
    the first to fourth resistors are configured so that the ideal component of the first detection signal and the ideal component of the second detection signal have respective different phases and the error components are reduced.

13. A lens position detection device for detecting a position of a lens whose position is variable, the lens position detection device comprising:
    the magnetic sensor according to claim 1; and
    a magnetic field generator that generates the target magnetic field, wherein the lens is configured to be movable in the first direction, and the magnetic sensor and the magnetic field generator are configured so that the strength of the magnetic field component changes with a change in the position of the lens.

14. The lens position detection device according to claim 13, further comprising a detection value generation circuit, wherein:

the magnetic sensor generates a first detection signal having a correspondence with a potential at the first output port, and generates a second detection signal having a correspondence with a potential at the second output port; and the detection value generation circuit generates a detection value having a correspondence with the position of the lens on a basis of the first and second detection signals.

15. The lens position detection device according to claim 14, wherein:

the magnetic field generator is a magnetic scale including a plurality of pairs of N and S poles alternately arranged in a predetermined direction;

the first and second detection signals each contain an ideal component varying periodically to trace an ideal sinusoidal curve, and an error component corresponding to a harmonic of the ideal component; and the first to fourth resistors are configured so that the ideal component of the first detection signal and the ideal component of the second detection signal have respective different phases and the error components are reduced.

16. A manufacturing method for a magnetic sensor that is for detecting a target magnetic field including a magnetic field component in a first direction parallel to an imaginary straight line, the magnetic sensor comprising:

first to fourth resistors each configured to change in resistance with strength of the magnetic field component;

a power supply port to which a current of predetermined magnitude is supplied;

a ground port that is grounded;

a first output port; and a second output port, wherein the first resistor and the second resistor are located in a first region and connected in series via a first connection point connected to the first output port, the third resistor and the fourth resistor are located in a second region and connected in series via a second connection point connected to the second output port, at least a part of the second region being located at a position different from the first region in the first direction, an end of the first resistor opposite to the first connection point and an end of the third resistor opposite to the second connection point are connected to the power supply port, an end of the second resistor opposite to the first connection point and an end of the fourth resistor opposite to the second connection point are connected to the ground port, the first and second resistors are located between the third and fourth resistors in a second direction orthogonal to the first direction, the first to fourth resistors each include a plurality of magnetoresistive elements; and the plurality of magnetoresistive elements each include a magnetization pinned layer having a magnetization whose direction is fixed, a free layer having a magnetization whose direction is variable depending on the direction and the strength of the magnetic field component, and a gap layer located between the magnetization pinned layer and the free layer, the manufacturing method for the magnetic sensor comprising a step of forming the plurality of magnetoresistive elements, wherein the step of forming the plurality of magnetoresistive elements includes:

a step of forming a plurality of initial magnetoresistive elements each including an initial magnetization pinned layer to later become the magnetization pinned layer, the free layer, and the gap layer; and a step of fixing a magnetization direction of the initial magnetization pinned layer using laser light and an external magnetic field.

\* \* \* \* \*